United States Patent [19]
Rao et al.

[11] Patent Number: 5,159,272
[45] Date of Patent: Oct. 27, 1992

[54] MONITORING DEVICE FOR ELECTRIC STORAGE BATTERY AND CONFIGURATION THEREFOR

[75] Inventors: Purushothama Rao, Eagan; William H. Kump, Mendota Heights, both of Minn.; Benny E. Jay, Austin; Clarence W. Fowler, Elgin, both of Tex.

[73] Assignee: GNB Incorporated, St. Paul, Minn.

[21] Appl. No.: 383,084

[22] Filed: Jul. 21, 1989

Related U.S. Application Data

[63] Continuation-in-part of Ser. No. 247,005, Sep. 20, 1988, abandoned, which is a continuation-in-part of Ser. No. 224,657, Jul. 27, 1988, abandoned, which is a continuation-in-part of Ser. No. 374,725, Jul. 3, 1989, abandoned.

[51] Int. Cl.$^5$ .................... H02J 7/00; G01N 27/416
[52] U.S. Cl. ........................... 324/429; 320/48; 340/636; 429/93
[58] Field of Search ............. 324/429, 435, 433; 340/636; 320/48; 429/90-93

[56] References Cited

U.S. PATENT DOCUMENTS

| | | |
|---|---|---|
| 640,787 | 1/1900 | Maxim . |
| 945,564 | 1/1910 | Marko . |
| 964,994 | 7/1910 | Marko . |
| 1,013,465 | 1/1912 | Van Wagenen . |
| 1,528,376 | 3/1925 | Jerabek . |
| 1,568,829 | 1/1926 | Goff . |

(List continued on next page.)

FOREIGN PATENT DOCUMENTS

| | | |
|---|---|---|
| 0074444 | 9/1981 | European Pat. Off. . |
| 0090338 | 3/1983 | European Pat. Off. . |
| 0110466 | 11/1983 | European Pat. Off. . |
| 0163822 | 3/1985 | European Pat. Off. . |
| 0273577 | 11/1987 | European Pat. Off. . |
| 2610536 | 3/1976 | Fed. Rep. of Germany . |
| 3331360 | 8/1983 | Fed. Rep. of Germany . |
| 59-75581 | 4/1984 | Japan . |
| 59-94381 | 5/1984 | Japan . |
| 60-220576 | 11/1985 | Japan . |
| 3331360-A | 3/1985 | United Kingdom . |

OTHER PUBLICATIONS

Patent Abstracts of Japan, vol. 7, No. 1111 (E-175)[1256], May 14, 1983 & JP-A-58 32 376 (Canon K.K.) Feb. 25, 1983.
Patent Abstracts of Japan, vol. 8, No. 92 (P-271)[1529], Apr. 27, 1984 & JP-A-59 7276 (Nihon Jidoushiya Seibi Shiyoukou Kumiai Rengoukai) Jan. 14, 1984.

*Primary Examiner*—Kenneth A. Wieder
*Assistant Examiner*—Maura K. Regan
*Attorney, Agent, or Firm*—Leydig, Voit & Mayer

[57] ABSTRACT

An electric storage battery is provided having a monitoring device for indicating the state-of-charge of the battery and particularly indicating whether a discharged battery is healthy and capable of being recharged or unhealthy and impending on a state of failure. The monitoring device achieves the foregoing by testing the open circuit voltage of the battery and determining if the voltage of the battery drops below a first preset value after application of a load and subsequently fails to rise above a second preset value after the load has been removed. Also, the monitoring device for the battery includes the capability of sensing when the battery has been placed into a system such as an engine system for an automobile and in response thereto modifying testing certain parameters. Preferably, the monitoring device is made integral with the battery case by providing a receptacle for receiving the device and a pair of connecting arms at least partially embedded in the battery container or cover.

56 Claims, 8 Drawing Sheets

U.S. PATENT DOCUMENTS

| | | | |
|---|---|---|---|
| 2,000,668 | 5/1935 | Pease . | |
| 2,030,651 | 2/1936 | Pease . | |
| 2,072,915 | 3/1937 | Willach et al. . | |
| 2,672,499 | 3/1954 | Radeke . | |
| 2,779,015 | 1/1957 | Walker et al. . | |
| 2,844,532 | 7/1958 | White et al. . | |
| 3,061,827 | 10/1962 | Fiandt et al. . | |
| 3,308,366 | 3/1967 | Arpin . | |
| 3,460,995 | 8/1969 | Webb . | |
| 3,600,234 | 8/1971 | Massie, Jr. . | |
| 3,621,359 | 11/1971 | Schnegg . | |
| 3,743,931 | 7/1973 | Brodhacker . | |
| 3,753,094 | 8/1973 | Furuishi et al. . | |
| 3,787,754 | 1/1974 | Seabase . | |
| 3,857,087 | 12/1974 | Jones . | |
| 3,873,911 | 3/1975 | Champlin . | |
| 3,876,931 | 4/1975 | Godshalk . | |
| 3,909,708 | 9/1975 | Champlin . | |
| 3,922,672 | 11/1975 | Birt et al. . | |
| 3,979,657 | 9/1976 | Yorksie . | |
| 3,997,888 | 12/1976 | Kremer . | |
| 4,012,681 | 3/1977 | Finger et al. . | |
| 4,021,718 | 5/1977 | Konrad . | |
| 4,027,231 | 5/1977 | Lohrmann . | |
| 4,061,839 | 12/1977 | Kohler . | |
| 4,080,560 | 3/1978 | Abert | 320/48 |
| 4,180,770 | 12/1979 | Eby . | |
| 4,193,025 | 3/1990 | Frailing et al. | 320/48 |
| 4,224,383 | 9/1980 | Taylor . | |
| 4,234,840 | 11/1980 | Konrad et al. . | |
| 4,237,198 | 10/1980 | Eby et al | |
| 4,247,811 | 1/1981 | Findl . | |
| 4,248,942 | 2/1981 | Eby et al. . | |
| 4,258,306 | 3/1981 | Bourke et al. . | |
| 4,284,944 | 8/1981 | Iwanaga et al. . | |
| 4,289,836 | 9/1981 | Lemelson . | |
| 4,304,823 | 10/1981 | Lemelson . | |
| 4,320,334 | 3/1982 | Davis et al. . | |
| 4,322,685 | 3/1982 | Frailing et al. . | |
| 4,388,618 | 6/1983 | Finger . | |
| 4,423,378 | 12/1983 | Marino et al. . | |
| 4,438,182 | 3/1984 | Papazian . | |
| 4,492,955 | 1/1985 | Kubota et al. . | |
| 4,560,937 | 12/1985 | Finger . | |
| 4,626,765 | 12/1986 | Tanaka . | |
| 4,637,965 | 1/1987 | Davis . | |
| 4,645,725 | 2/1987 | Kump et al. . | |
| 4,665,370 | 5/1987 | Holland . | |
| 4,675,255 | 6/1987 | Pfeifer et al. . | |
| 4,680,527 | 7/1987 | Benenati et al. . | |
| 4,693,949 | 9/1987 | Kellett et al. . | |
| 4,769,295 | 9/1988 | Kudo et al. . | |

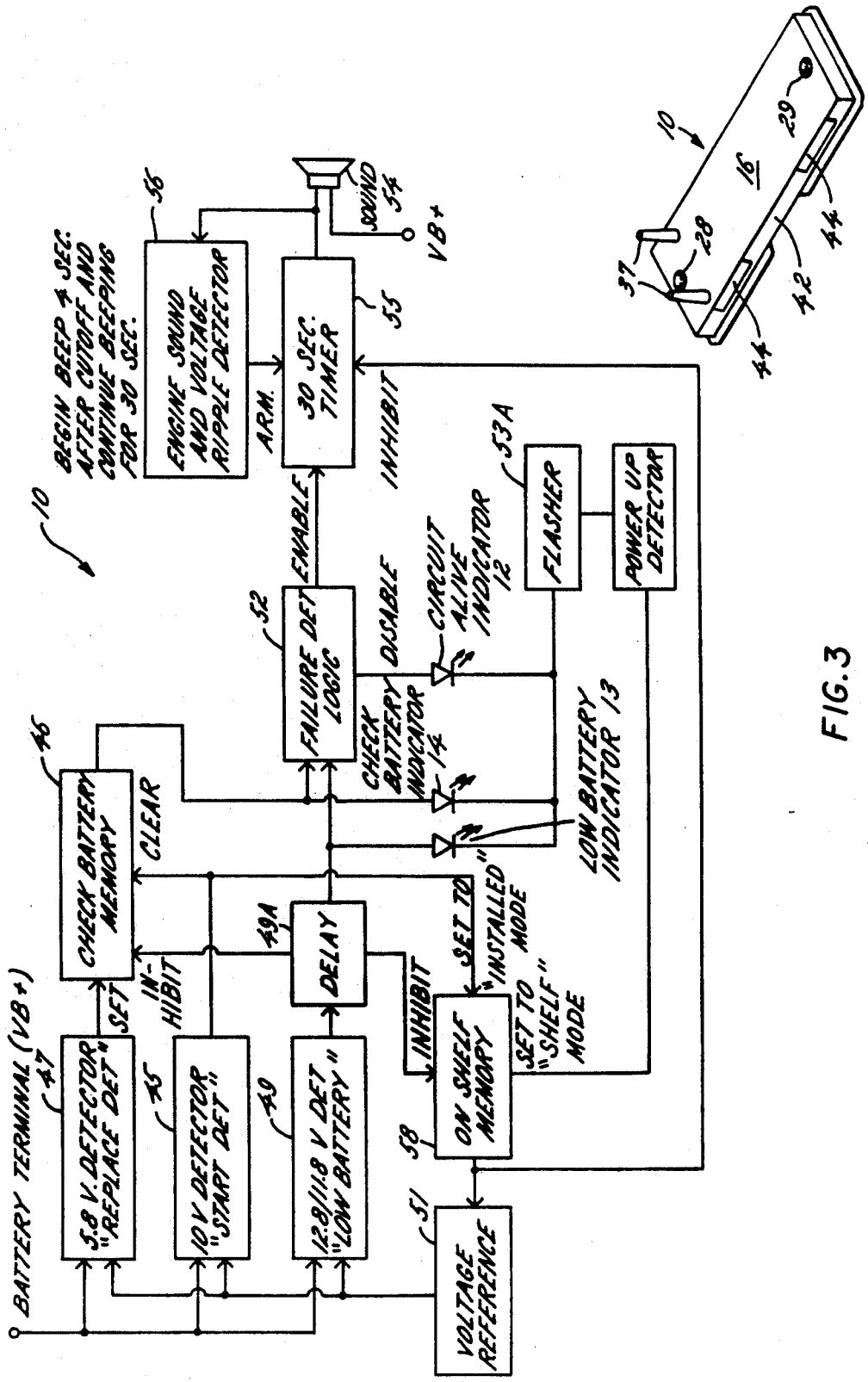

_MONITORING DEVICE FOR ELECTRIC STORAGE BATTERY AND CONFIGURATION THEREFOR_

RELATED APPLICATIONS

This is a continuation-in-part of U.S. Ser. Nos. 247,005, filed Sep. 20, 1988, 224,657, filed Jul. 27, 1988, and 374,725, filed Jul 3, 1989, all now abandoned.

FIELD OF THE INVENTION

The present invention relates generally to the testing of multi-cell electric storage batteries, and more particularly, to devices for testing the condition of an automobile battery upon engine cranking to distinguish between discharged and near failure states.

BACKGROUND OF THE INVENTION

In the design of electric storage batteries, it is frequently desirable to include a device for monitoring and indicating the state-of-charge, and hence the relative strength of the battery. Rudimentary devices for providing such an indication were developed very early in the art, as described, for example, in U.S. Pat. Nos. 964,995 to P. M. Marko and 1,010,337 to H. H. Kemph. The device described in each of these patents includes a volt meter which is secured to the cover of the battery, and which is connected to the terminals of the battery by wire leads. The volt meter disclosed in these patents does not continually monitor the condition of the battery. Instead, the meters are associated with simple push button switches which, when depressed, serve to electrically connect the meters to the terminals. In this way, the strength of each battery can be ascertained by depressing the switch, causing a short circuit through the volt meter. The meter then indicates the voltage of the battery.

More recent devices for indicating the state-of-charge of an electric storage battery are described in U.S. Pat. Nos. 4,248,942 to R. L. Eby et al, 4,467,017 to T. R. Jackson and 4,665,370 to Holland. The first of these patents discloses an electric monitoring and indicating device which includes a light emitting diode (LED) which indicates when the battery has reached a preselected state-of-charge. The device continues to provide such an indication until the battery has been discharged to a second, preselected state.

The Jackson '017 patent contemplates a completely different state-of-charge monitoring device, and comprises a secondary electrolytic cell located within the electrolyte of a larger, primary cell. The secondary cell is intended to provide an output which is dependent upon the characteristics of the electrolyte, and which is said to vary proportionally with the state-of-charge of the primary cell. The structure of the device disclosed in the Jackson '017 patent is complex, and does not appear to be easily suitable for use in the manufacture of mass-produced lead-acid batteries. Nor does the device of the Jackson '017 patent disclose the specific indicator used to measure the output of the secondary cell. It appears likely, however, that the indicator contemplated by the Jackson patent, like the indicator of the Eby '942 patent, would be separate from the battery itself.

Also known in the art are automobile battery testers which measure the condition of a battery when put under load by, for example, the cranking of an associated automobile engine. One such tester is described in the previously identified '370 Holland patent. The Holland battery testing device compares the voltage of an unloaded battery with the voltage of the battery under load in order to determine whether a change in the battery voltage between the unloaded and loaded conditions is greater than a preset limit or alternatively whether the voltage is less than a preset value. However, prior art battery testers such as that taught by the Holland patent do not distinguish between an healthy battery merely in a state of low charge and a unhealthy battery near failure. Nor do such prior art testers isolate a failure between the battery and the automobile electrical system.

More recently, microprocessor technology has been incorporated into battery testers as exemplified by U.S. Pat. No. 4,725,784 to Peled et al. Although a microprocessor-based system for a battery tester provides an opportunity for complex testing, systems such as that in the '784 patent to Peled et al. do not distinguish between a healthy battery in a discharged state and an unhealthy battery nearing a failure state. The Peled et al. patent, for example, utilizes the power provided by a microprocessor to evaluate the state-of-charge of the battery in connection with a plurality of different sensor readings such as temperature and voltage recovery times. In connection with the execution of a test sequence for evaluating the state-of-charge of the battery, the Peled et al. device measures both the unloaded and loaded voltages across the terminals of the battery. However, these voltages are measured in isolation of other voltage measurements for the single purpose of determining whether the battery voltage is out of a range of values within which the battery voltage must stay in order for the test procedure to provide an accurate reading.

In the context of a lead-acid automobile starting, lighting and ignition (SLI) battery, it is highly desirable to include the monitoring device in the cover or side wall of the battery, so that the status of the battery can be readily determined without resort to separate testing apparatus. This permits the battery to be easily monitored when warehoused prior to installation in an automobile, and once installed, to be monitored by the automobile operator who is apt not to have a volt meter, hydrometer or other testing device.

SUMMARY OF THE INVENTION

It is an object of the present invention to provide a monitoring device for a battery which separately indicates whether a discharged battery is healthy and capable of being recharged or is unhealthy and impending on a failure state; the latter, of course, being of particular concern to an automobile operator.

It is another object of the invention to provide a monitoring device which is able to determine automatically whether the battery is installed in an automobile system or merely stored and awaiting placement into such a system. In this connection, it is also an object of the invention to modify the testing procedure executed by the monitoring device automatically in response to a determination whether the battery is installed in an engine system or stored and awaiting future placement.

It is yet another object of the invention to provide a battery and monitoring device wherein the voltage of the battery is continually monitored, notwithstanding whether the battery is connected to a load.

It is still another object of the present invention to provide a lead-acid battery for SLI and other applications having an electric monitoring device integral therewith for indicating the condition of the battery. A more specific object includes providing a receptacle in the cover or side wall of the battery to allow the installation of a monitoring device therein.

In connection with the foregoing objects, it is still another object of the invention to connect the monitoring device to the electrochemical components of the battery in a way which is protected from corrosion, damage and loosening, and which is easily and economically manufactured.

Other objects and features of the present invention will become apparent to those skilled in the art upon reading the following detailed description and upon reference to the drawings.

In accordance with the present invention, the foregoing objects are achieved by a monitoring device which tests (1) the state-of-charge of a battery by measuring its open circuit voltage and (2) its state-of-health by determining if the voltage of the battery drops below a first preset value after initiation of engine cranking and subsequently fails to rise above a second preset value. In connection with the monitoring of the battery voltage during engine cranking, false indications of an unhealthy state are prevented by ensuring the open circuit voltage is indicative of a sufficiently charged battery prior to the cranking event. If the open circuit voltage indicates the battery is partially or fully discharged, the voltage check during cranking is disabled.

A monitoring device in accordance with the present invention preferably operates in two alternative modes—i.e., a "SHELF" mode or an "INSTALLED" mode. The SHELF mode allows the dealer to monitor the state of the battery during the time it is warehoused and serves to alert the dealer to a state of low charge. The monitoring device is initially set to the SHELF mode of operation and automatically switches to the INSTALLED mode on the first crank of the engine. The device has visual indicators for displaying the battery condition and an audible alert when there is a need to check the battery. In the SHELF mode, only the visual indicators are active. In the INSTALLED mode, the audible alert is also activated. When the alert sounds, the motorist may then inspect the visual indicators.

The foregoing monitoring device may be externally attached to the battery; however, it is preferably made integral with the battery case by providing a receptacle for receiving the device and a pair of connecting arms embedded in at least one wall of the battery container or cover for electrically communicating the device with the electrochemical components of the battery.

Preferred embodiments of the invention are specifically directed to electric storage batteries having different terminal configurations and, therefore, different structures for electrically connecting the monitoring device to the output of the battery. While the present invention will be disclosed and discussed primarily in terms of those preferred embodiments, it is not intended to be limited thereto. Other modifications and embodiments will be apparent to those skilled in the art.

BRIEF DESCRIPTION OF THE DRAWINGS

A written description setting forth the best mode presently known for carrying out the present invention, and of the manner of implementing and using it, is provided by the following detailed description, with reference to the attached drawings, wherein;

FIG. 2 is an isometric view of the bottom side of the packaging for the monitoring device shown in FIG. 1;

FIG. 3 is a block diagram of a monitoring device in accordance with the present invention;

FIG. 15 is a partial sectional view taken generally along line 19—19 of FIG. 18 showing certain details of the bushing.

DETAILED DESCRIPTION OF THE PREFERRED EMBODIMENTS

Figure 1:
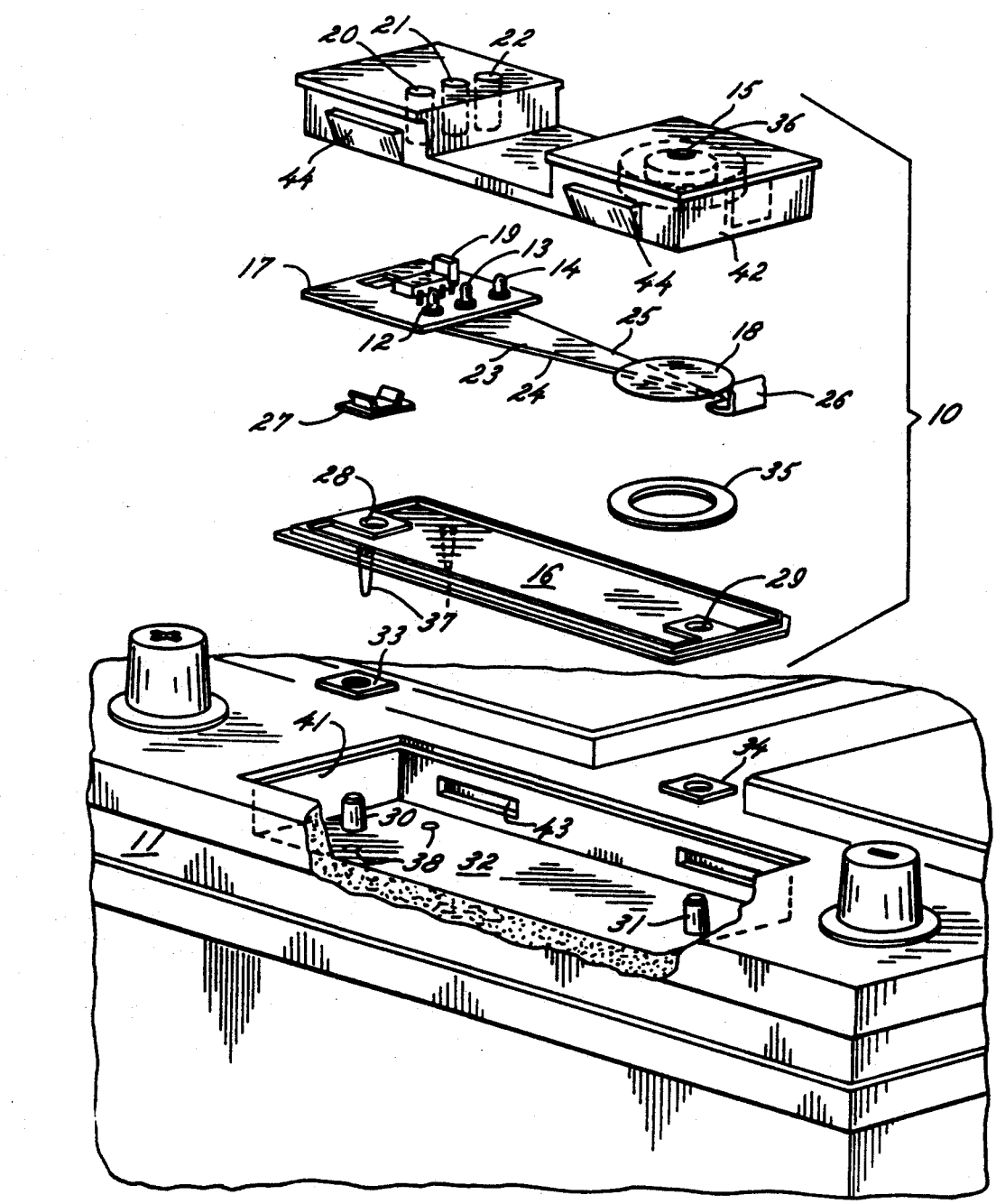
FIG. 1 is an exploded view of an exemplary packaging for the, monitoring device of the invention.

Turning to the drawings and referring first to FIGS. 1 and 2, a monitoring device 10, when electrically connected to a storage battery 11, is designed to provide a series of visual and audible signals to indicate the condition of the battery. In one mode of operation illustrated herein, the monitoring device 10 has three distinct high intensity light emitting diode (LED) indicators 12, 13 and 14, each being associated with a separate voltage condition as may be explained, for example, on a decal (not shown) attached to the monitoring device itself.

The first LED 12 simply indicates whether the battery 11 is charged and in operating condition by continuously pulsating so long as none of the other LEDs are lit. If any of the other LEDs are turned on, indicating an abnormal voltage condition, the first LED 12 will go off. None of the LEDs will be lit, however, if the output voltage of the battery drops below a very low threshold voltage such as 2.2 volts. Such a threshold voltage generally indicates the presence of an open connection within the battery.

In accordance with one important aspect of the invention, second and third LEDs 13 and 14 are provided for distinguishing between a healthy discharged battery and an unhealthy discharged battery impending on a state of total failure. Specifically, the second LED 13 indicates an undercharged condition and is turned on in a no-load condition when the voltage across the terminals of the battery falls below a first predetermined voltage. The third LED 14 will be turned on if the battery voltage falls from a voltage above the first predetermined voltage to a voltage below a second predetermined voltage during the time the engine is turned over or "cranked" by a starter motor. The third LED 14 will be turned off if the voltage of the battery 11 recovers to a third predetermined voltage, and remains above the second predetermined voltage when the engine is next turned over.

So that an automobile owner will be aware of a battery malfunction, or an impending no-start condition, the monitoring device 10 includes an audio annunciator which will sound when there is an undercharge or impending no-start condition, and which is operative only when the battery is installed. The annunciator is preferably a piezoelectric device which functions as a vibration sensor in addition to its function as an audio device. As explained in greater detail hereinafter in connection with FIGS. 3 and 4A-4B, these dual functions are utilized so that the audio alarm sounds for a certain period of time, approximately thirty seconds, only after the engine stops. In this way, an automobile operator will be alerted to check the condition of the battery 11, and then determine whether to have the battery serviced during the next routine maintenance of the automobile, or whether the situation requires immediate replacement on an emergency basis.

In accordance with another important aspect of the invention, it is contemplated that at least one of the three LEDs also be associated with circuitry within the monitoring device 10 which automatically resets the monitoring function, as described below, once the battery 11 is installed in an automobile, and therefore under load. In the illustrated embodiment, the monitoring device includes circuitry for detecting the placement of a load across the terminals of the battery 11 and, in response thereto, adjusting the value of the first predetermined voltage associated with the second LED 13. By sensing the placement of a load across the terminals of the battery 11, the circuitry detects the transfer of the battery from a temporary storage area (i.e., a "SHELF" mode) to installation in an engine system (i.e., an "INSTALLED" mode). Because of the different environments of the SHELF and INSTALLED modes, an undercharged condition is indicated by different terminal voltage values, depending on the mode. By detecting a change from SHELF mode to INSTALLED mode, the circuitry of the monitoring device accounts for the change in environment by automatically adjusting the value of the first predetermined voltage. By providing a SHELF mode operation, a battery distributor will be apprised of the condition of the battery 11 while it is kept in his warehouse, thus eliminating the risk of selling a defective battery.

Those skilled in the art will appreciate that the monitoring device of the present invention can be designed to monitor and indicate a variety of charging conditions in addition to those described above. For example, a fourth LED (not shown) can be provided to indicate an overcharged condition. This LED is turned on if the voltage of the battery 11 exceeds, for example, 16.6 volts, notwithstanding whether the battery is installed in an automobile, and therefore under load, or whether the battery is in a no load condition on a warehouse shelf. Once the overcharge LED is turned on, it will turn off when the voltage drops below 16.6 volts; but in an operating mode, when installed in an automobile, the fourth LED will remain lit only so long as the output of the battery is greater than 11.8 volts. If the voltage drops below 11.8 volts, the fourth LED is turned off.

Referring now more specifically to FIGS. 1 and 2, the packaging for the monitoring device 10 comprises a housing having upper and lower surfaces 15, 16 into which a fully assembled printed circuit board 17 and a piezoelectric transducer element 18 are assembled. The electronic circuitry of the device 10 (shown in discrete form in FIGS. 4A-4B) is formed in a custom integrated circuit 19. Also included on the printed circuit board 17 are the LEDs 12, 13 and 14. The lenses of the LEDs 12, 13 and 14 are preferably colored to provide ready identification of the particular test indication. For example, the LED 12 may have a green lens indicating the battery is properly charged and healthy. The LED 13 may have a yellow lens indicating the battery is undercharged but healthy. Finally, the LED 14 may have a red lens indicating the battery is unhealthy and its failure is imminent. Also to be included on printed circuit board 17 is an oscillator capacitor 9. Formed in the plastic housing cover 15 are individual wells 20, 21 and 22 for the LEDs 12, 13 and 14.

Wire connections 23 and 24 provide power to the piezoelectric element 18. Wire 25 makes the actual connection between a terminal contact sleeve 26 and the printed circuit board. A second terminal contact sleeve 27 is soldered to the printed circuit board, and terminal contact sleeve 26 is pressed into an appropriate cavity provided in the housing bottom 16. The terminals 26 and 27 are in registration with openings 28 and 29 formed in the housing bottom. The openings 28 and 29 are placed so as to receive secondary battery terminals 30 and 31 when the battery monitoring device 10 is placed within the receptacle 32 in the case of battery 11. Also provided are resilient acid proof adhesive seals 33 and 34 which are attached to the bottom cover 16 at the locations of openings 28 and 29.

The piezoelectric element 18 is received within an acoustic chamber formed in the cover 15. A chamber seal 35 is provided to environmentally seal the acoustic chamber. The cover includes a sound output port 36 for the exit of the audible alert signal.

Figure 9:
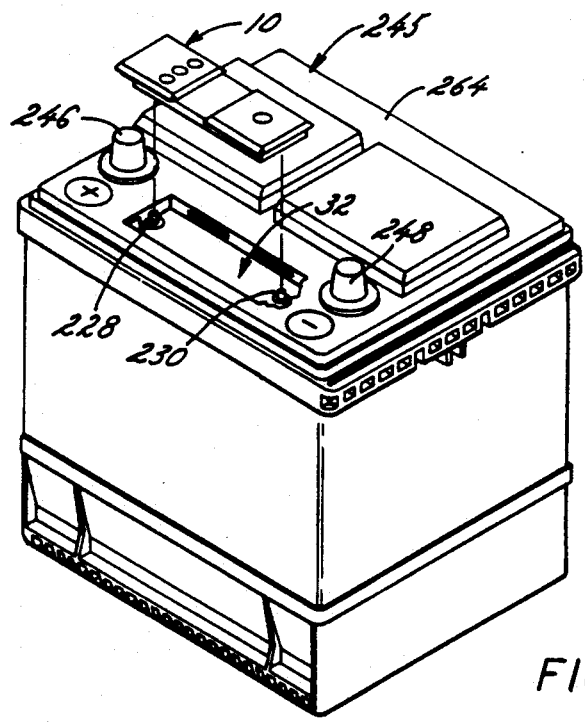
FIG. 9 is an isometric view of a second exemplary embodiment of the installation of the monitoring device into a battery in accordance with the present invention and illustrates the arrangement of the terminals in a battery having a pair of top terminals.
Figure 10:
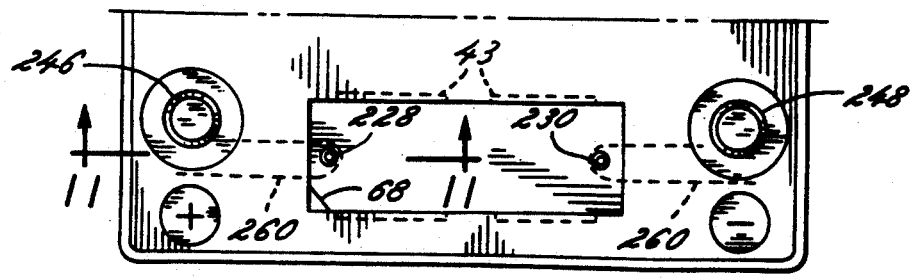
FIG. 10 is a top plan view of a portion of the cover of the battery shown in FIG. 9 and further illustrating the terminal arrangement.

A pair of guide posts 37 depend from the lower surface of the housing 15 in order to key the housing into the receptacle 32, thereby ensuring the pair of contact sleeves 26, 27 electrically engage the secondary terminals 31, 32 with the correct polarity. Specifically, the guide posts 37 cooperate with guide ways 38 in the bottom surface of the receptacle 32 and serve to align the monitoring device 10 therein. The monitoring device 10 can also be aligned as shown in FIGS. 9 and 10. The housing for the monitoring device disclosed therein has a notched corner 39 which mates with a stepped portion 40 which is molded into a corner of the bottom surface of the receptacle. Those skilled in the art will appreciate that this alternative eliminates the need for guide posts and guide ways and other alignment means.

To secure the monitoring device 10 within the receptacle 32, the side walls 41 of the receptacle and the sides 42 of the monitoring device are provided with retaining means which cooperate to retain the monitoring device in the receptacle once the monitoring device is installed therein. The retaining means shown in FIG. 1 are slots 43, which are integral with the longitudinal side walls 41 of the receptacle 32, and corresponding interlocking tabs 44, which are integral with the housing of the monitoring device. The compressed resilient seals 33 and 34 provide upper pressure on the assembly to ensure that the locking mechanism provides the necessary vertical retention forces to hold the assembly securely in place. It is desirable to form the slots 43 during the injection molding process if the cover is formed in that way.

It should be appreciated, however, that the location and shape of the retaining means can vary considerably, the only requirement being that the monitoring device be retained in the receptacle so as not to become accidentally dislodged or loosened. It should also be appreciated that while the slots and tab members must provide a sufficient retaining force to prevent the monitoring device from breaking free of the battery, the slots and tabs can be designed to permit the monitoring device to be removed from the receptacle, so that the same or another monitoring device can be subsequently reinstalled.

As may be understood from the drawings, once the monitoring device is locked in the cover of the battery, the housing of the monitoring device shields the connection between the contact sleeves 26, 27 and the secondary terminals 30, 31 from environmental contaminants. As will be explained in greater detail hereinafter, it is also extremely important that there be no gas or electrolyte leakage from around the secondary terminals.

Turning to the block diagram of the monitoring device 10 in FIG. 3, when the device senses that the engine is being cranked, as by engagement of a starter motor, a start detector 45 generates a strobe signal. The start detector 45 issues the strobe signal based upon the voltage of the battery 11 dropping below a 10 volts level. The strobe signal is applied to memory 46 to initialize its operation during an engine start-up operation, which places the battery 11 under load. A second input to memory 46 is the output of detector 47, which has a preset 5.6 voltage threshold value. If the voltage of the battery goes from above 11.8 volts (open circuit) to below 5.6 volts (closed circuit) during an engine start-up operation, the memory 46 is set, thereby activating the LED 14 and indicating the battery is in an unhealthy state. Memory 46 retains this state condition of the battery 11 until the battery passes a subsequent start test.

If the battery terminal voltage (open circuit) falls below 11.8 volts, the low charge detector 49 output signal will be applied to the LED indicator 13 which indicates a low state of charge. If either the charge detector 49 output or the memory 46 output occurs, the LED indicator 12, which indicates that the battery 11 is in an acceptable condition, is inhibited by logic 52.

Most everyone has at some time forgotten to turn off the headlights of their automobile only to return sometime later and find the automobile's battery so discharged that it cannot start the engine. In such situations, the battery is healthy but severely discharged, possibly below the 5.6 volt threshold of the detector 47. In order to ensure a deeply discharged but healthy battery is not misidentified by the LED 14 as nearing a state of failure, a delay circuit 49A disables the memory 46 if the battery voltage VB+ falls below 12.4/11.8 volts (depending on the battery mode) for more than a predetermined time period—e.g., five seconds. The delay circuit 49A also disables the memory 58 in order to prevent the monitoring device from switching to an "INSTALLED" mode in response to the battery voltage falling below 10 volts while stored in a warehouse or the like.

In essence, the delay circuit 49A cooperates with the detectors 45 and 47 to prevent false indications that the battery has been installed into an automobile or that it is in an unhealthy condition. For example, without the delay circuit, a slow decay of the battery voltage to a level below the 10 volts detected by the detector 46 may give a false indication that a battery has been installed into an automobile. Without the delay circuit 49A, further slow decay of the battery voltage to a value below the 5.6 volts detected by detector 47, will indicate the battery is in an unhealthy state. Such a slow decay is more likely associated with a healthy but deeply discharged battery.

In the monitoring device 10 of the invention, once the battery voltage falls below the 12.4/11.8 volt threshold of detector 49 (depending on the mode), the "low battery" indicator LED 13 is activated. If the battery voltage remains below the 12.4/11.8 volt threshold for more than a predetermined time period, the monitoring device assumes that a slow discharge is occurring. During a slow discharge, the memories 46 and 58 are inhibited so that further decay of the battery voltage below the 10 and 5.6 volt thresholds of detectors 45 and 47, respectively, does not result in the device switching modes or the LED indicator 14 being activated. Detectors 45 and 47 are intended for detection of a relatively fast discharge associated with the connection of the battery to a load, such as for example a starter motor of an automobile engine. Therefore, the delay circuit 49A assures that the detectors 45 and 47 do not set the memories 46 and 58 in response to a slow discharge of the battery voltage to values below the 5.6 and 10 volt thresholds of the detectors.

A flasher 53 provides a signal to the LED indicators 12, 13 and 14 to cause them to flash on and off. If either the low charge LED indicator 13 or the failed state LED indicator 14 is present, a sound generator 54 is activated to produce an audible alert signal for approximately 30 seconds. Timer 55 controls the audible alert after detector 56 determines that the engine has been shut off.

The charge detector 49 has its preset voltage threshold level established by the voltage reference 51 at 12.4 volts in the SHELF mode. In the INSTALLED mode, the charge detector threshold is reduced to 11.8 volts. The SHELF mode is established by way of a power up detector 53A. When the device is first placed into the receptacle 32 and power from the battery 11 is applied, the power up detector 53A causes the memory 58 to set in a SHELF mode, thereby causing the detector 49 to detect a 12.4 volt threshold and inhibiting the sound generator 54. Upon the first engine start-up operation after installation of a battery with device 10, detector 45 responds to the battery voltage falling below 10 volts and causes the memory 58 to change the threshold of charge state detector 49 to 11.8 volts.

Figure 4A:
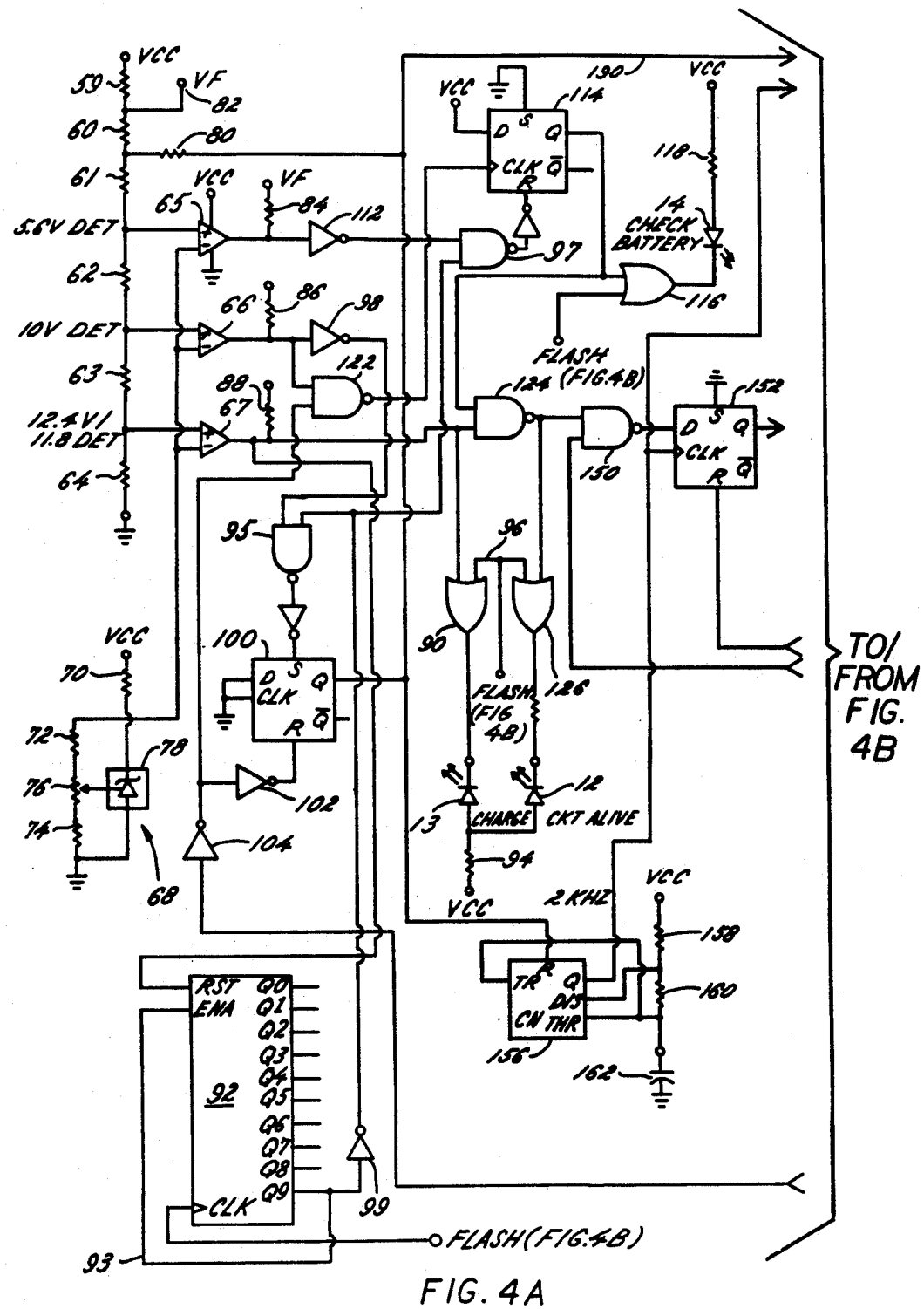
FIG. 4A-4B is a schematic diagram of circuitry for implementing the block diagram of FIG. 3.
Figure 4B:
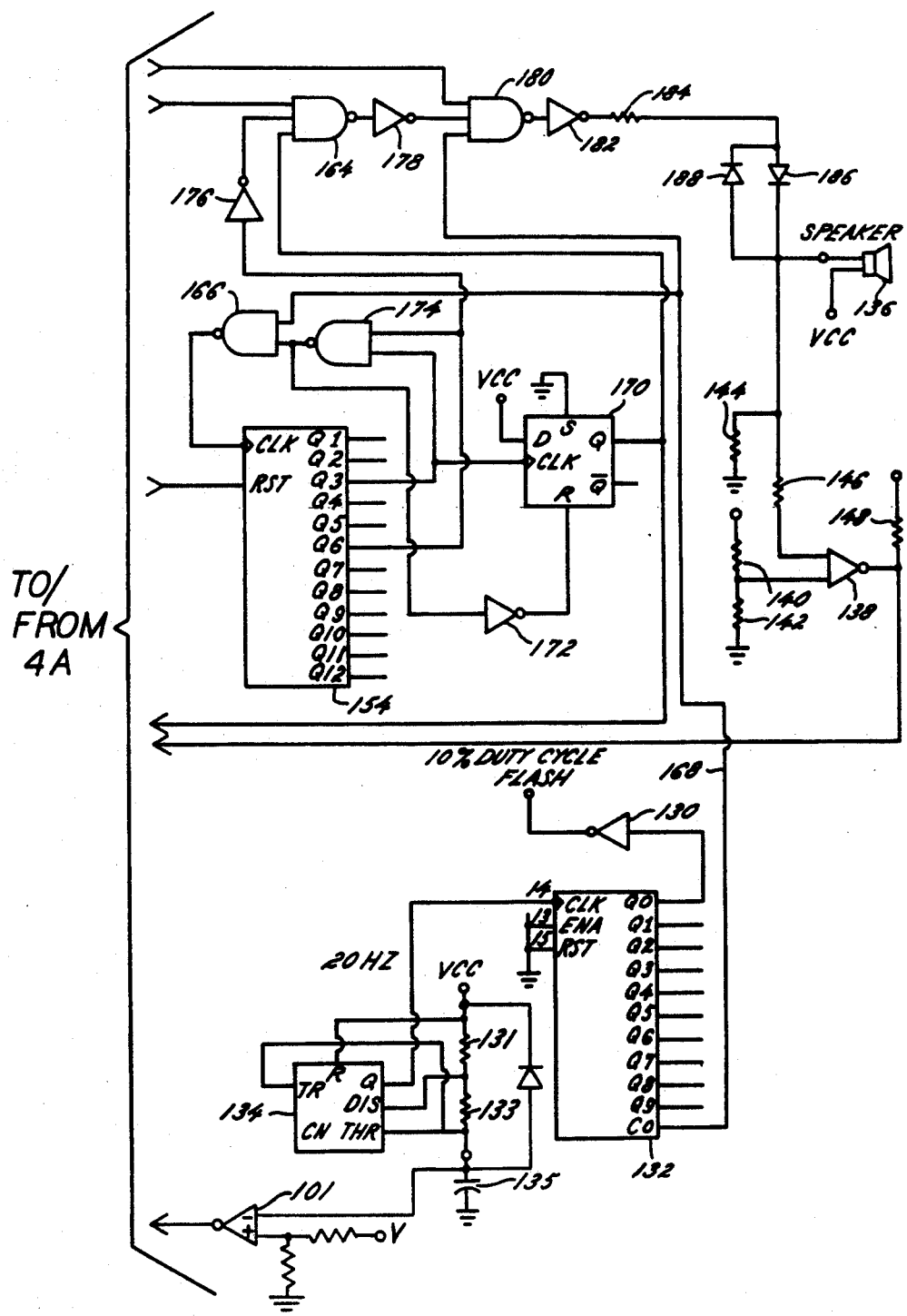

Referring now to FIGS. 4A and 4B, the charge, tart and failure detectors 49, 45 and 47, respectively, and the voltage reference 51 are implemented by voltage-sensing threshold detectors. The circuitry for these detectors includes a voltage divider network and three comparators. The input voltages for the comparators are provided by dividing the voltage of the positive battery terminal using the voltage divider network. The voltage divider network derives from the incoming battery voltage a particular level required for a respective comparator. The voltage divider network includes resistors 59, 60, 61, 62, 63 and 64.

The voltage divider network provides separate input voltages to comparators 65, 66 and 67. The output of each comparator assumes a logic "1" if the voltage on the non-inverting input is larger than the voltage on the inverting input. Comparator 65 is the failure detector 47 and has a 5.6 volt detection level established on the non-inverting input by the voltage divider network. Comparator 66 corresponds to the start detector 45 and has a 10 volt detection level established at its non-inverting input. Comparator 67 is the change detector 49 and has a SHELF mode detection level of 12.4 volts or an INSTALLED mode level of 11.8 volts established on its non-inverting input.

The inverting input of each of the comparators is maintained at a voltage level by regulator 68 which includes resistors 70, 72 and 74 in combination with potentiometer 76 and zener diode 78. The voltage level on the inverting inputs is derived from the battery under test and varies with the battery voltage level.

Resistor 80 which is connected to the voltage divider network serves to lower the detection level of comparator 67 to 11.8 volts in the INSTALLED mode and raise the threshold to 12.4 volts in the SHELF mode. The terminal 82, which is designated VF, connects to resistors 84, 86 and 88 to form a feedback path between the output of each comparator and its input. The feedback connection causes a sharp transition of the comparator output when the detection level is reached.

When the battery terminal voltage drops below 12.4 volts or 11.8 volts, depending on the circuit mode, the voltage on the non-inverting input of comparator 67 drops below tee voltage level on the inverting input. The output of comparator 67 goes low to a logic "0." The output of comparator 67 is coupled to an input of OR gate 90, NAND gate 124 and to the reset (RST) input of a ring counter 92. The output of OR gate 90 is coupled to the LED indicator 13 by way of current limiting resistor 94. When the output of OR gate 90 goes to a low condition, it sinks current and permits LED 13 to be turned on. As long as the output of comparator 67 is at a logic "1" level, OR gate 90 inhibits activation of LED 13. When, however, the output of comparator 67 drops to a logic "0," the indicator 13 can be activated in order to indicate a state of low charge. LED 13 is turned-on when the second input 96 to OR gate 90 assumes a logic "0" level. The second input to OR gate 90 is a signal designated "flash." This signal is obtained from an oscillator circuit to be described. The flash signal is a waveform which alternates on a prescribed duty cycle between a high voltage level corresponding to a logic "1" and a low voltage level corresponding to a logic "0." This signal waveform serves to cause the "charge" LED 13 to flash on and off.

The delay circuit 49A of FIG. 3 is implemented by the ring counter 92 in FIG. 4A. In response to the detection of the battery voltage following below the threshold of 12.4/11.8 volts detected by comparator 67, the reset input to the load changes from a logic "1" to "0", thereby freeing the counter to count pulses from the "flash" signal for the LEDs 12, 13 and 14 obtained from inverter 130 which is connected to a second ring counter 132 as illustrated in FIG. 4B. A timing circuit 134, which is set to oscillate at a 20 Hertz rate, provides the clock input to counter 132. A ten percent duty cycle for the "flash" signal is established.

With the battery voltage below 12.4/11.8 volts, the counter 92 counts the "flash" pulses. Upon activation of the output $Q_9$, the counter is disabled by way of feedback line 93. The logic "1" at the $Q_9$ output remains present and provides a logic "0" to one of the inputs of each of NAND gates 95 and 97. The other input to each of these NAND gates receives a voltage detection signal from one of the comparators 65 and 66. The outputs of the NAND gates 95 and 97 are inverted by inverters 103 and 105, respectively, and then delivered as inputs to memories 46 and 58 (FIG. 3) as embodied in flip-flops 100 and 114. With the $Q_9$ output from the ring counter 92 at a logic "0" present at one of the inputs of each of the NAND gates 95 and 97, a signal from either of the comparators 65 and 66 is effectively blocked from reaching the set and reset inputs of the flip-flops 100 and 114, respectively.

From the foregoing description of the interaction of the comparators 65, 66 and 67, the counter 92 and the NAND gates 95 and 97, it will be appreciated that detection signals from the comparators 65 and 66 must be generated within a predetermined time period after comparator 67 has detected the battery voltage falling below 12.4/11.8 volts in order for the flip-flops 100 and 114 to receive the signals. Once the battery voltage falls below 12.4/11.8 volts, the counter 92 begins to count flash pulses and it is a race between the counter and the rate of change of the battery voltage. If the rate of change of the battery voltage is sufficiently great (indicating a load has been applied to the battery), the 10 volt level detected by comparator 66 will be reached before the $Q_9$ output of the counter 92 is activated and blocks the set input to flip-flop 100. Alternatively, a slowly changing battery voltage will not reach the 10 volt level before the $Q_9$ output is activated and blocks the input to flip-flop 100. The same race with respect to flip-flop 114 occurs between the counter 92 and a signal from the comparator 65 detecting a battery voltage of less than 5.6 volts.

Once the counter 92 has begun or completed its count of flash pulses, it can be returned to its reset condition by the battery voltage rising above the 12.4/11.8 level, thereby causing a logic "1" to return to its reset (RST) input. When reset, the $Q_9$ output of the counter 92 goes to a logic "0" and the inputs to the NAND gates 95 and 97 receiving the output from $Q_9$, via inverter 99, are at a logic "1". In this state, the NAND gates pass any detection signals from the comparators 65 and 66.

During the first cranking operation after the battery has been installed in an automobile, the voltage falls below the 10 volt detection level of comparator 66 and the output of comparator 66 assumes a logic "0" level, assuming the signal from the comparator 66 occurs before the counter 92 has activated its $Q_9$ output. Inverter 98 responds to the logic "0" level at the output of comparator 66 to produce a signal which sets flip-flop 100. The output of flip-flop 100 connects to resistor 80, and when flip-flop 100 is set, the monitoring device is placed in the INSTALLED mode. With the output of flip-flop 100 at a logic "1" level, resistor 80 is effectively removed from the voltage divider network. This has the effect of decreasing the desired value of the voltage detection threshold established at the non-inverting input of comparator 67.

In terms of the operation of monitoring device 10, the significant aspect of the operation of flip-flop 100 concerns the automatic switching of the device from the SHELF mode to the INSTALLED mode. In this regard, the change in the detection threshold of comparator 67 from 12.4 volts to 11.8 volts is of significance. Once the device is in the INSTALLED mode, the detection threshold levels of 5.6 volts for comparator 65 and 10 volts for comparator 66 are established. When flip-flop 100 is reset by a signal obtained from inverter 102, resistor 80 is reconnected to the voltage divider network. The input to inverter 102 is the output of inverter 104 which receives its input from the power up detector 53A (FIG. 3) as implemented by comparator 101 in FIG. 4B. When power is applied to the monitoring device, the rising voltage at the positive input of the comparator 101 leads the voltage at the negative input, thereby causing the comparator to output a logic "1". When the capacitor 135 is fully charged, the voltage at the negative input to the comparator 101 is greater than the voltage at the positive input, causing the output of the comparator to go to a logic "0". The result is a pulse delivered to the flip-flops 100 and 114, resetting the former and clocking a logic "1" to the Q output of the latter. With the flip-flops 100 and 114 reset and clocked, the monitoring device is initialized in the SHELF mode.

If during engine cranking the voltage level of the battery decreases below the 5.6 volt detection threshold of comparator 65, the output of comparator 65 goes to a logic "0" condition. This signal is passed through inverter 112 and applied to AND gate 97. Assuming the signal from the comparator 65 arrives at the AND gate 97 before the counter 92 activates its $Q_9$ output, the signal is passed through the gate as a reset input to the flip-flop 114. In its reset condition, flip-flop 114 provides a logic "0" input to OR gate 116. The output of OR gate 116 upon the low voltage transitions of the "flash" input signal, sinks current through resistor 118 and LED 120. This provides the visual indication to check the battery because its state of health is such that it is near failure.

The clock input to flip-flop 114 is obtained from NAND gate 122. The inputs to this gate are obtained from inverter 104 and from the output of comparator 66. If a logic "0" level appears at either the output of comparator 66 or at the output of inverter 104, the output of NAND gate 122 provides a logic "1" output, which serves as a clock input to flip-flop 114. Such a clock input serves to set the flip-flop and de-activate the check battery indicator. Establishing the monitoring device in the SHELF mode by way of a pulse from comparator 101 as previously explained serves to produce a clock input to flip-flop 114. Also, as the 10 volt threshold level on comparator 66 is passed, a clock input is provided to flip-flop 114 to initialize it for operation in the event the 5.6 volt threshold of comparator 65 is passed.

One of the inputs to NAND gate 124 is the output of comparator 67. The other input to NAND gate 124 is the output of flip-flop 114. So long as the output of comparator 67 is in a logic "1" condition and flip-flop 114 remains in the "set" state, NAND gate 124 provides a logic "0" level to OR gate 126. This logic level combined with the flash signal serves to cause LED 12 to flash, which indicates that the battery is in good condition and no problem has been recorded.

Battery testing device 10 also provides an audible alert that the battery should be checked. The audio generating element or speaker 136 is a piezoelectric tone generator. In accordance with the present invention, this device is used to both generate an audible tone and to sense whether or not the vehicle engine is running. The audible alarm is only activated after there has been detection that the engine was running and then stopped. When the audible alarm has been activated, it continues for 30 seconds. In order for it to again be activated, there must be detection that the engine has again been started and then stopped.

When the audible alarm is not activated, tone generator 136 provides an input to comparator 138. The non-inverting input of comparator 138 is set to a reference voltage by resistors 140 and 142. This voltage is approximately the voltage that is generated by the transducer element 136 when receiving the sound of a car engine running. If the engine is running, the inverting input of comparator 138 has a voltage level thereon which exceeds the reference level on the non-inverting input. The voltage of transducer element 136 is applied to the inverting input of comparator 138 via resistors 144 and 146. Conversely, if the engine is stopped, the voltage on the inverting input of camparator 138 is less than the reference voltage established on the non-inverting input. The output of comparator 138 is also connected to a pull-up resistor 148 to provide for a sharp transition of the comparator output.

The output of comparator 138 is applied as an input to NAND gate 150. The other input to NAND gate 150 is from NAND gate 124. The output of NAND gate 150 is applied as the input to flip-flop 152. When the battery is in a good condition, NAND gate 124 has a logic "0" at its output. Thus, NAND gate 150 will have a logic "1" at its output regardless of the input it receives from comparator 138. A clock input to flip-flop 152 will maintain the flip-flop output at a logic "1." This condition of flip-flop 152 will in turn establish a reset input to register 154.

The clock input for flip-flop 152 is obtained from oscillator circuit 156. This circuit is similar to oscillator 134; but it oscillates at a two KHz rate. The rate of oscillation is established by resistors 158 and 160 in combination with capacitor 162. The rate of oscillation of oscillator 134 is similarly established by resistors 131 and 133 in combination with capacitor 135. A reset input to oscillator ciruict, 156 is provided by the output of flip-flop 100. Thus, when the testing device is in the SHELF mode, oscillator 156 is inhibited from operation. When the device 10 assumes its INSTALLED mode, then oscillator 156 is enabled for operation. The output of oscillator 156 is also applied as an input to NAND gate 164 for operation of the audible alert in a manner to be described.

Register 154 sequentially places a logic "1" cleared to a logic "0" by the reset input from flip-flop 152. The shift register 154 is clocked by a signal obtained from NAND gate 166. The basic clock input to NAND gate 166 is obtained from counter 132 at its "carry-out" output. The signal is conducted to NAND gate 166 over line 168. With the other input to NAND gate 166 at a logic "1" level, the clock signal over line 168 will cause register 154 to be clocked. If the reset input to register 154 remains low for a sufficient period of time for output Q3 to go high, a clock input will be applied to flip-flop 170. If flip-flop 170 is not being held in the reset condition by inverter 172, the output will be set to a logic "1." The reset signal from inverter 172 will be generated when the output of NAND gate 174 goes to a logic "0." This will occur when register 154 has counted up such that both the Q3 and the Q6 outputs are at a logic "1" level. The logic "0" output from NAND gate 174 will also result in clock pulses to register 154 being inhibited. Register 154, flip-flop 170, and gates 166 and 174 constitute a control circuit and timer for the audible alert.

In the operation of the audible alert, the transducer 136 will be activated when the Q3 output of register 154 goes high. The audible alert will remain activated until the Q6 output of register 154 goes high. The audible alarm is deactivated as a result of inverter 176 applying the Q6 output of register 154 to NAND gate 164. The other input to NAND gate 164 is the output of flip-flop 170. The output of NAND gate 164 is coupled through inverter 178, NAND gate 180, inverter 182, resistor 184 and the parallel combination of diodes 186 and 188. The signal propagating through that chain of logic is eventually applied to the transducer element 136. The two KHz driving signal for the transducer is from oscillator 156 and passes through the chain of logic. When inverter 176 applies a logic "1" as an input to NAND gate 164 and flip-flop 170 is set to also provide a logic "1" input to NAND gate 164, the 2 KHz driving signal is allowed to propagate through to NAND gate 180. If device 10 is in the INSTALLED mode, a logic "1" level is applied as an input to NAND gate 180 over line 190 from flip-flop 100, and provided a logic "1" level is available from the carry-out of counter 132, gate 180 passes the two KHz driving signal.

By way of summary review of operation, when testing device 10 is installed with a battery in vehicle, and the engine is running, sound generated by the engine and/or battery terminal ripple voltage caused by the alternator will cause transducer element 136 to produce a voltage which is communicated through comparator 138 to produce a reset signal to register 154. Flip-flop 170 is maintained in the reset state which inhibits NAND gate 164 from passing the two KHz signal from oscillator 156. Thus the alarm is deactivated.

When the engine is turned-off, the reset input to register 154 is removed. This permits register 154 to begin incrementing with each clock pulse coming over line 168 from counter 132. When register 154 has incremented for a period of time such that the Q3 output goes high, flip-flop 170 is set, which permits NAND gate 164 to pass the two KHz signal to the transducer 136. The audible alert continues until register 154 increments to a point where the Q6 output goes high. This results in inverter 176 applying a deactivating signal to NAND gate 164. In order for the audible alert to again be activated, there must be a reset signal applied to register 154. This would result when the engine has once again been cranked such that sound or alternator noise is detected by comparator 138.

The table presented below provides an identification of the circuit components and element values used in the illustrative embodiment shown in FIGS. 4A-4B.

TABLE

| RESISTORS | OHMS |
| --- | --- |
| 59 | 1.0K |
| 60 | 4.21K |
| 61 | 61.9K |
| 62 | 28.0K |
| 63 | 6.19K |
| 64 | 34.0K |
| 70 | 6.2K |
| 72 | 5.6K |
| 74 | 51.0K |
| 76 | 10.0K |
| 80 | 100.0K |
| 84 | 110.0K |
| 86 | 110.0K |
| 88 | 110.0K |
| 94 | 820 |
| 106 | 10.0K |
| 108 | 5.1K |
| 118 | 820 |
| 131 | 130.0K |
| 133 | 560.0K |
| 140 | 680.0K |
| 142 | 1.0K |
| 144 | 100.0K |
| 146 | 10.0K |
| 148 | 110.0K |
| 158 | 13.0K |
| 160 | 56.0K |
| 184 | 330 |

| Logic IC's | |
| --- | --- |
| Comparators 65, 66, 67, 101 138 | LM 339 |
| Flip-flops 100, 114, 152, 170 | 4013 |
| Timers 134, 156 | LM 555 |
| Counter 92, 132 | 4017 |
| Counter 154 | 4040 |
| Inverters 98, 99, 102, 103, 104, 105, 112, 130, 172, 176, 178, 182 | 4049 |
| OR Gates 90, 116, 126 | 4071 |
| NAND Gates 95, 97, 122, 124, 166, 174 | 4011 |
| NAND Gates 164, 180 | 4023 |
| Components | |
| Volt Reg. 78 | TL 431 IP |
| Diodes 186, 188 | IN 914 |
| Capacitor 135 | .1 µF |
| Capacitor 162 | .01 µF |

Turning to the installation of the monitoring device 10 and referring generally to FIGS. 5-20, the assembled and packaged battery monitoring device is shown being installed into batteries having various terminal configurations. Regardless of the arrangement of the terminals, the storage batteries of the preferred embodiments of the present invention share certain features. In each case, the electrochemical components are set within a solid rectangular shaped container made of an injection molded thermoplastic. The interior of the container is divided by partition walls into a series of cells, and within each cell an electrode stack is disposed in contact with a liquid electrolyte.

The electrode stacks comprise alternating positive and negative plates. The positive and negative plates of each cell stack are connected in parallel, respectively, by positive and negative conductive straps. The electrode stacks are generally connected in series by at least one intercell connection between the conductive straps. The conductive straps of each inner cell group have one such intercell connection, although multiple intercell connections are possible. The conductive strap in each of the two end cells is a terminal conductive strap, and is, as the name implies, electrically connected to the positive and negative plates and the corresponding positive or negative battery terminals. In the case of dual terminal and top terminal batteries, the positive and negative terminals are connected to the terminal conductive strap through a pair of element posts and bushings. In the case of a side terminal battery, the positive and negative terminals are generally connected directly to the terminal conductive straps.

Figure 5:
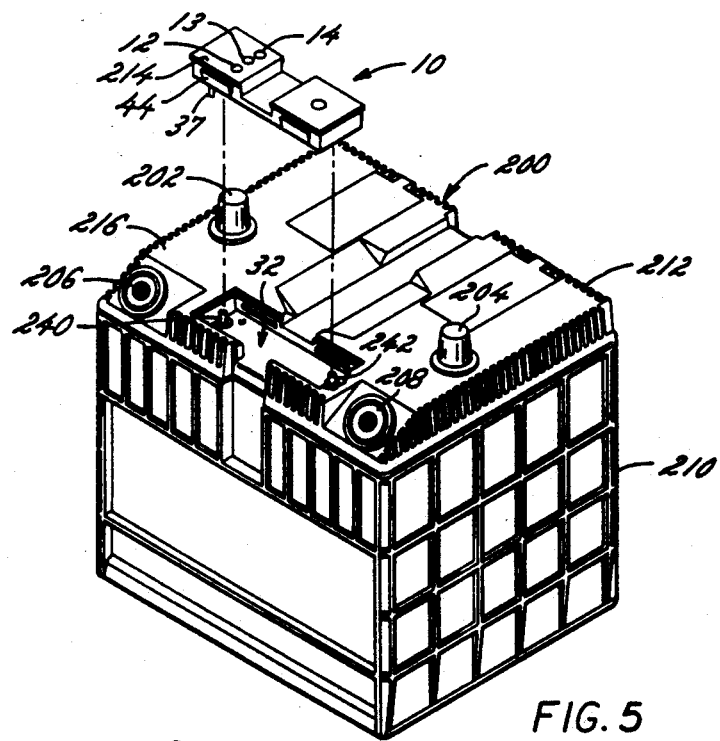
FIG. 5 is an isometric view of a first exemplary embodiment of the installation of the monitoring device into a battery and illustrates the arrangement of the terminals in a battery having a pair of top and side terminals.

Turning now to FIG. 5, a battery 200 for receiving the monitoring device 10 includes two top terminals 202, 204 and two side terminals 206, 208 and comprises a generally rectangular shaped container 210 which is sealed to a cover 212. Such batteries are often called "dual terminal batteries" because they have two pairs of positive and negative terminals. An example of a dual terminal battery is disclosed in U.S. Pat. No. 4,645,725 to W. H. Kump et al., which is assigned to GNB Incorporated. Except as discussed hereinafter, the particular configuration of the cover 212 and the container 210 is not considered critical. A wide variety of configurations have been proposed in the art and may be utilized in the context of the present invention. In addition, a wide variety of thermoplastic resins and molding techniques are known and may be used to form the container 210 and cover 212. When injection molding techniques are used, the preferred material for battery parts of this type is an ethylene-propylene copolymer. Likewise, any of several known techniques for sealing the cover 212 to the container 210 may be used, e.g., heat sealing with or without adhesives, adhesives alone, or solvents.

Inasmuch that the generally rectangularly shaped receptacle shown in FIG. 5 is similar to that illustrated in FIG. 1, the same numbers used to identify the receptacle in FIG. 1 will be repeated in connection with FIG. 5. It should be understood, however, that the shape and placement of both the receptacle and the monitoring device may be changed without departing from the scope of the present invention. The monitoring device 10, for example, could be mounted in a wall of the container 210, rather than the cover 212, of the battery 200. This configuration is particularly suitable for many industrial applications. Also, the monitoring device 10 can electrically communicate with a battery via wire extensions from the terminals, permitting the monitoring device to be carried external to the battery casing, rather than carried as an integral part thereof. Preferably, however, when the monitoring device 10 is mounted in the cover 212, the monitoring device 10 and the receptacle 32 are sized so that the upper surface 214 (FIG. 5) of the monitoring device remains either below or is flush with the top surface 216 of the cover 212. When the monitoring device 10 is below or flush with the top surface 216 of the cover 212, the monitoring device appears to be an integral part of the cover, and is not only protected from accidental damage, but will not interfere with battery hold-down cables and the like.

Figure 6:
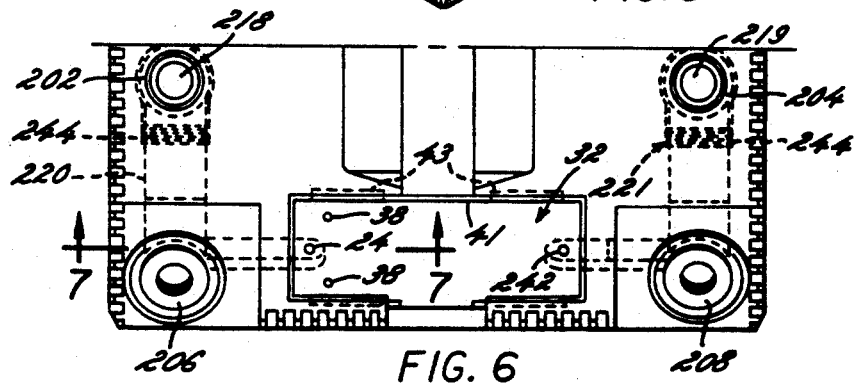
FIG. 6 is a top plan view of a portion of the cover of the battery shown in FIG. 5 and further illustrating the terminal arrangement.
Figure 7:
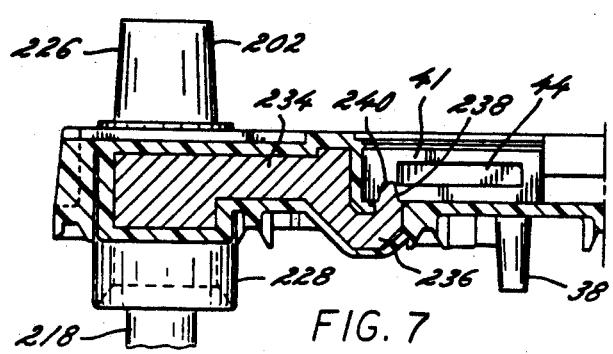
FIG. 7 is a partial sectional view taken generally along line 7—7 of FIG. 6 showing certain details of a bushing forming part of the terminal arrangement.

As best shown in FIGS. 6 and 7, the top and side terminals 202, 204, 206, 208 of the dual terminal embodiment of the present invention are electrically connected to a single pair of element posts 218, 219 by a single pair of bushings 220, 221. The element posts 218, 219 are of a generally cylindrical shape and are designed to be welded to the single pair of bushings 220, 221, respectively. This arrangement significantly contributes to the construction of a strong, reliable and leakproof connection. By providing a single pair of bushings 220, 221 and a single pair of element posts 218, 219, the number of element post/bushing welds through which leakage can occur is two, the absolute minimum that can be achieved.

Those skilled in the art will appreciate that each bushing 220, 221 itself may contribute or exacerbate the problem of electrolyte and gas leakage from the interior to the exterior of the battery. In general, electrolyte may creep along the seal between each part of the battery 200. This is especially true if there is an imperfect seal. In particular, electrolyte leakage can occur at the plastic to plastic heat seal between the battery container 210 and the cover 212, between the bushings 220, 221 and the plastic, and between the bushings and the element posts 218, 219.

Electrolyte creepage not only reduces the amount of electrolyte in the cells, but can corrode the terminals 202, 204, 206, 208 and impair conductivity to the terminal connections as well. The acid in the electrolyte is also harmful to skin, clothing and other materials which it contacts. Gases which are evolved while charging the battery also pose serious problems. The gases can leak through the various seals, particularly around the bushing if the weld to the element post is faulty. As will be explained in greater detail below, the bushing and cover of the present invention are designed to inhibit electrolyte and gas leakage.

Figure 8:
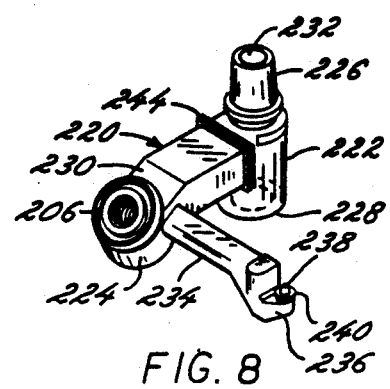
FIG. 8 is an isometric view of the bushing of FIG. 7.

As best shown in FIGS. 7 and 8, each bushing 310 of the dual terminal embodiment of the present invention comprises a main body portion 311, a side terminal end 312, a top terminal end 313, an element post end 314, a first connecting arm 315, and a generally cylindrical hole 316 passing axially through the main body portion, the element post end, and the top terminal end and adapted to receive one of the element posts 218. The bushings 220, 221 may be formed from any of the several lead-based alloys that are known to be suitable for lead-acid battery terminals. Conventional casting techniques may be employed to allow easy fabrication of the bushing. While the bushing can be formed in multiple pieces and then welded together, it is contemplated that the bushing of the present invention be cast, since unitary casting contributes to a strong, sturdy bushing which is not easily broken during normal use. Casting is also very economical and suitable for mass production.

The top terminals 202, 204 are each in electrical communication with one of the top terminal ends 226 of the bushings, but, as disclosed in the '725 patent to W. H. Kump et al., are not a separate part per se. Instead, the top terminals are formed from the top terminal ends of the bushing and the element post. That is, the top terminals are formed during and result from the welding of the bushings and the element posts. Accordingly, whereas FIGS. 4 and 5 illustrate the top terminal composite, FIG. 8 illustrates the top terminal end of the bushing 220 from which the top terminals are formed. The welding itself may be accomplished by conventional techniques, for example, welding, with or without the use of a weld fill. The top terminals are then trimmed, if necessary, to the desired height.

In accordance with yet another important aspect of the invention, a secondary connecting arm 234 extends from the first connecting arm 230 and terminates in a secondary terminal end 236. The secondary terminal end comprises a conical section 238 which protrudes through and extends beyond the bottom surface of the receptacle and makes up one of the secondary terminals 240 and 242 (50 and 52 in FIG. 1). The length and shape of the secondary connecting arm are dependent in part upon the size and location of the receptacle 32, and upon the placement of the electrical connecting sleeves 42, 44 disposed on the lower surface 22 of the monitoring device itself. The size and shape of the secondary connecting arm are also dependent on the manner in which the secondary connecting arm is placed in the cover, as will be explained in greater detail below.

In accordance with yet another aspect of the invention, the bushings are at least partially and preferably substantially completely embedded in the cover 212. By embedding the bushing substantially completely in the cover, the length of the plastic/ bushing seal and, accordingly, the electrolyte creepage path are increased. Additionally, the durability of both the seal and the bushing is increased as compared to conventional bushings mounted in relatively thin walls. Embedding the secondary connecting arm also serves to stabilize the bushing in the cover, thus providing further resistance to a torque applied to the top or side terminals. Moreover, by substantially completely embedding the bushings within the cover of the battery, the bushings are now isolated from the acids and gases in the battery, and are therefore removed from the corrosive effects thereof. The bushing may be embedded by conventional techniques, such as by precasting the bushing and placing it in the mold during the injection molding of the cover. Those skilled in the art will appreciate, however, that when the cover is formed by injection molding, the bushings, including the secondary connecting arms, must be sized to resist the pressures developed when the plastic is introduced into the mold. The bushing, and in particular the secondary connecting arms, should be sized so as not to be deformed or displaced during the molding process.

Ribs 244 are disposed along the first connecting arm 230 of the bushing, although similar ribs could be provided along any and all parts of the bushing which are embedded in the cover 212. The inclusion of the ribs 244 on the bushing is believed to decrease the possibility of electrolyte leakage by increasing the length of the seal. The ribs 244 also enhance the strength of the bushing and plastic seal interface and the strength of the bushing itself, therefore increasing its durability.

Figure 11:
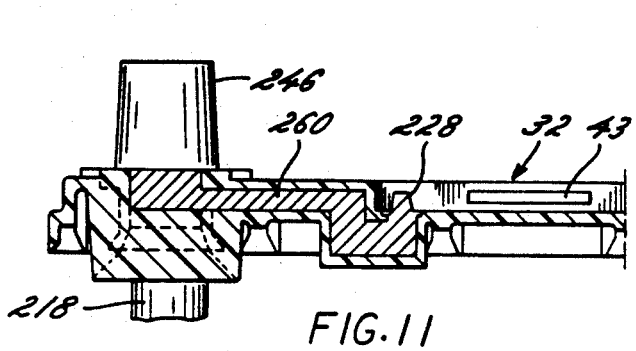
FIG. 11 is a partial sectional view taken generally along the line 11—11 of FIG. 10 showing certain details of a bushing forming part of the terminal arrangement.
Figure 12:
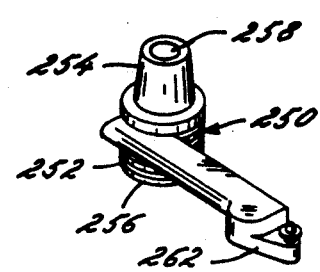
FIG. 12 is an isometric view of the bushing of FIG. 11.

FIG. 9 shows a second exemplary embodiment of the installation of the monitoring device in accordance with a preferred embodiment of the present invention. In this embodiment, a battery 245 has two top terminals 246, 248, rather than top and side terminals as described in connection with the first embodiment, and as shown in FIG. 5. Because there is no side terminal, each bushing 250 is consequently comprised of a main body portion 252, a top terminal end 254, and an element post end 256, wherein the element post end, main body portion, and top terminal end define a hole 218 passing substantially axially therethrough and adapted to receive one of the element posts 218. The bushing also includes a connecting arm 260 as shown in FIGS. 11 and 12, which extends laterally from the main body portion and terminates in a secondary terminal end 262. The function and purpose of the connecting arm is identical to the function and purpose of the secondary connecting arm 234 shown in FIGS. 6-8. In keeping with a preferred aspect of the present invention, each of the bushings 250 should be manufactured and substantially embedded in the cover 264 of the battery 245 in the manner described in connection with the dual terminal bushings 220, 221 shown in FIGS. 6-8.

Figure 13:
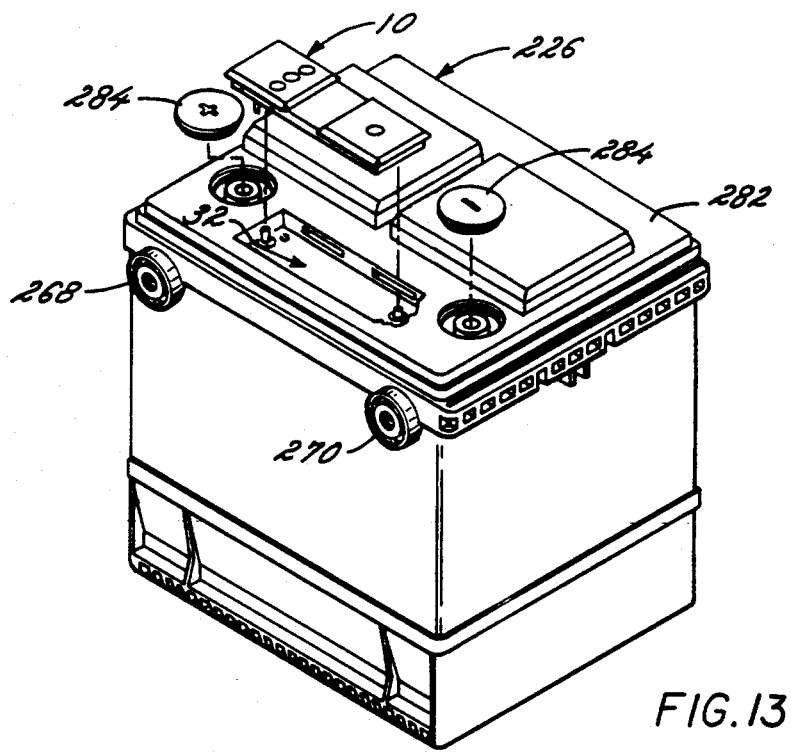
FIG. 13 is an isometric view of a third exemplary embodiment of the installation of the monitoring device in a battery according to the present invention and illustrating the arrangement of the terminals in a battery having side terminals.
Figure 14:
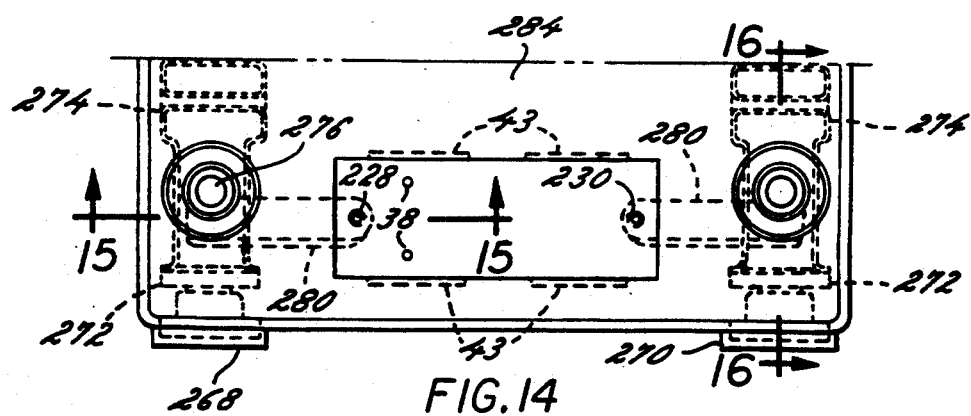
FIG. 14 is a top plan view of a portion of the cover of the battery shown in FIG. 13 and further illustrating the terminal arrangement.
Figure 15:
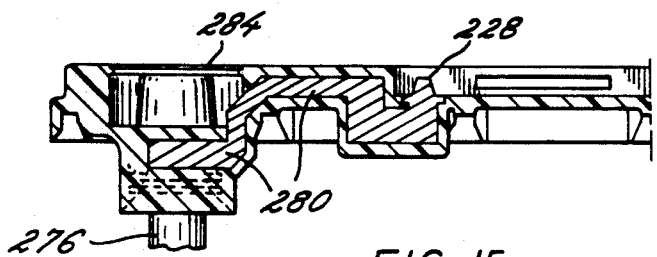
FIG. 15 is a partial sectional view taken generally along the line 15—15 of FIG. 14 showing certain details of a bushing forming part of the terminal arrangement.
Figure 16:
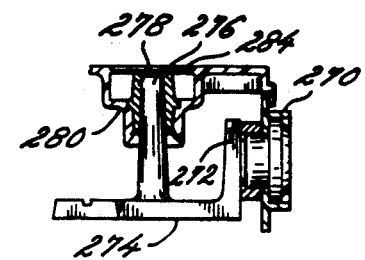
FIG. 16 is a partial sectional view taken generally along line 16—16 of FIG. 14 showing further details of the bushing.
Figure 17:
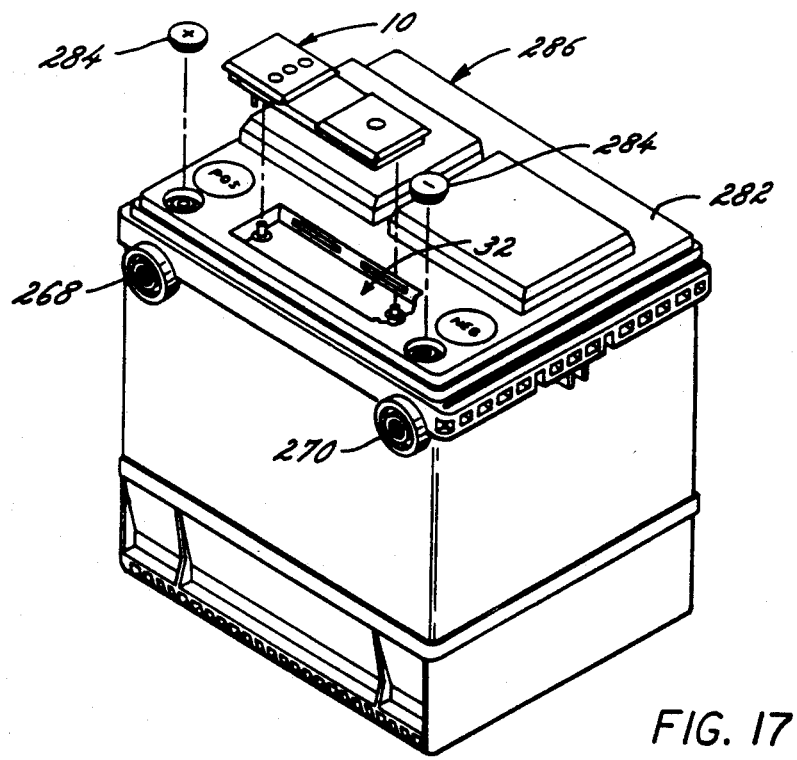
FIG. 17 is an isometric view of a fourth exemplary embodiment of the installation of the monitoring device in a battery in accordance with the present invention and illustrating an alternative bushing configuration for a battery having side terminals.
Figure 18:
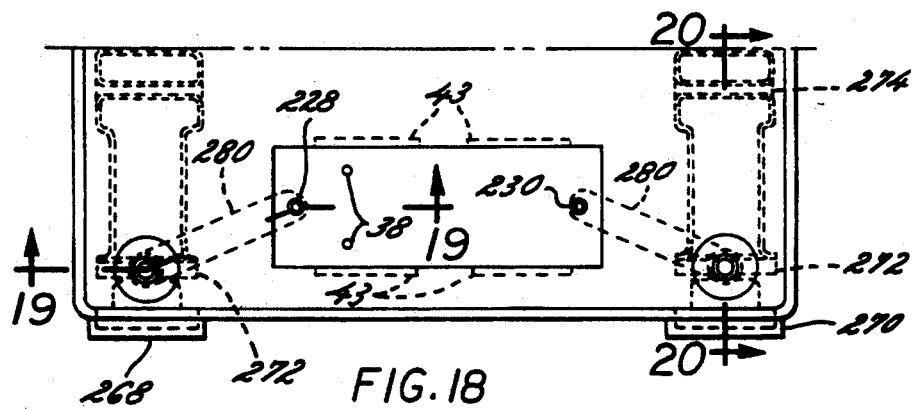
FIG. 18 is a top plan view of a portion of the cover of the battery shown in FIG. 17 and further illustrating the terminal and bushing arrangement.
Figure 19:
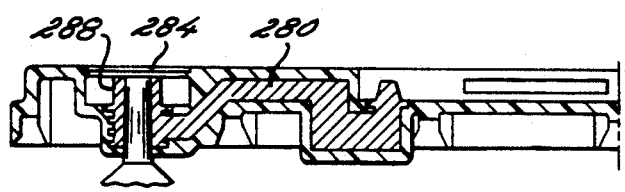
Figure 20:
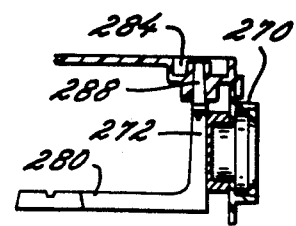
FIG. 20 is a partial sectional view taken generally along line 20—20 of FIG. 18 showing further details of the bushing.

FIGS. 13 through 16 show a third exemplary embodiment of the preferred installation of the monitoring device and disclose a side terminal battery 266 having the monitoring device 10 disposed therein. As best shown in FIG. 16, each of the side terminals 268, 270 is welded directly to an L-shaped section 272 of one of the terminal straps 274. In this particular embodiment, each of the terminal straps 274 has an upstanding post 276 which is adapted to be received within a hole 278 passing axially through one end of a connecting arm 280. The connecting arm 280 is composed of a lead-alloy and is substantially completely embedded in a cover 282 of the battery and extends from the upstanding post 276 to one of the secondary terminals 228, 230 mounted through the bottom of the receptacle 32. The monitoring device 10 is therefore placed in electrical communication with the electrochemical components of the battery through the combination of the terminal strap 274, the upstanding post mounted thereon 276, and the connecting arm 280 which terminates in one of the secondary terminals 228, 230. A secure connection is made between the upstanding post and the connecting arm by a weld, which is hidden by a plastic cover 284 as shown in FIG. 13.

A fourth exemplary embodiment of the preferred installation of the monitoring device is shown in FIGS. 17 through 20. These figures disclose a side terminal battery 286, which differs from the side terminal battery disclosed in FIGS. 13 through 16 in several respects. In lieu of the upstanding post shown in FIG. 16, the connecting arm is welded directly to the upper end 288 of the L-shaped section 272 of the terminal strap 274. This eliminates the need for the upstanding post 276 shown in FIG. 16 and simplifies the manufacture of the conductive strap 274. In all other respects, the fourth exemplary embodiment is constructed and functions in a manner virtually identical to that of the side terminal battery shown in FIG. 13. In this regard, parts common to both embodiments carry the same number identifiers.

While this invention has been disclosed primarily in terms of specific embodiments thereof, it is not intended to be limited thereto. Other modifications and embodiments will be apparent to those skilled in the art. For example, the invention has been described primarily in the context of a lead-acid, multi-cell battery for an automotive SLI application, but it should be appreciated that such batteries may be utilized in other vehicles and applications. The illustrative embodiments have also been described in terms of conventional electrochemical components, but other configurations could also be employed. Additionally, the electrochemical system need not be based on lead-acid, but may be other electrochemical systems, if desired. Furthermore, other configurations of the present invention may be made as an individual monitoring device which can be attached to the battery terminals to ascertain the condition of the battery.

We claim:

1. In an electric storage battery having a housing comprising a plurality of walls for enclosing the electrochemical components of said battery and further having at least one pair of positive and negative battery terminals suitable for connecting said battery in an engine system, an apparatus for electrically communicating with the electrochemical components of said battery and testing the health thereof, said apparatus comprising:

a monitoring device received by a receptacle formed in one of said walls of said battery;

first means electrically associated with at least one pair of battery terminals for placing said monitoring device in electrical communication with the electrochemical components of said battery;

said monitoring device including a low charge detector for detecting a first voltage condition across said terminals and in response thereto indicating said battery is being operated in a state of low charge but remains capable of starting said engine;

said monitoring device also including a replacement detector for detecting a second voltage condition across said terminals of said battery and in response thereto indicating said battery is being operated in a state that is impending on a state of low charge which is insufficient to start said engine;

signalling means responsive to said first and second circuits for signalling the detection of said first or second voltage conditions; and said monitoring device further including a start detector for detecting a third voltage condition following a previous detection of said second voltage condition and causing said signalling means to remove any indication of the previous detection.

2. An apparatus as set forth in claim 1 wherein said monitoring device includes a circuit for detecting the first connection of a load across said terminals and in response thereto changing said first voltage condition from a first value to a second value reflecting the battery transferring from a shelf mode to an installed mode.

3. An apparatus as set forth in claim 1 wherein said second voltage condition is the voltage across said terminals momentarily dropping below a first value when a load is placed across said terminals.

4. An apparatus as set forth in claim 3 wherein said third voltage condition is the voltage across said terminals rising above a second value greater than said first value after said load is removed from across said terminals and thereafter not falling below said first value when said load is again placed across said terminals.

5. An apparatus as set forth in claim 1 wherein said signalling means includes an alarm system having a first means responsive to said first or second voltage conditions for generating audible acoustic vibrations.

6. An apparatus as set forth in claim 5 wherein said alarm system includes a second means for sensing the running of an engine associated with said battery and in response thereto preventing the generation of said audible acoustic vibrations.

7. An apparatus as set forth in claim 6 wherein said second means of said alarm system includes a timer for permitting generation of said audible acoustic vibrations for a predetermined time after said second means no longer senses the running of said engine.

8. An apparatus as set forth in claim 6 wherein said first and second means of said alarm system both include a piezoelectric tone generator for alternately generating acoustic vibrations or detecting mechanical or acoustical vibrations so as to sense the running of said engine.

9. An apparatus as set forth in claim 1 wherein said first means is substantially completely embedded in one of said walls.

10. An apparatus as set forth in claim 1 wherein said monitoring device and the receptacle include means for aligning the monitoring device therein in order to ensure a correct electrical connection between the monitoring device and the electrochemical components of said battery.

11. An apparatus as set forth in claim 1 wherein said receptacle is recessed in said one wall and sized so that the top surface of said monitoring device is approximately flush with said one wall.

12. An apparatus as set forth in claim 11 wherein said monitoring device and said receptacle include means which cooperate to retain the monitoring device in the receptacle once the monitoring device is installed therein.

13. An apparatus as set forth in claim 12 wherein said retaining means includes means for permitting the monitoring device to be removed from the receptacle and subsequently reinstalled.

14. The apparatus as set forth in claim 1 wherein said first means includes at least one pair of terminal bushings at least partially embedded in said one wall with each of said bushings in electrical contact with at least one of said terminals.

15. The apparatus as set forth in claim 14 wherein each of said terminal bushings extends from at least one of said terminals to said receptacle and terminates within said receptacle so as to form a terminal which contacts a complementary terminal associated with said monitoring device and thereby communicate electrical energy and a voltage signal to said monitoring device from said battery.

16. The apparatus as set forth in claim 15 wherein each of said bushings is provided with one or more ribs circumferentially disposed on the surface thereof.

17. An apparatus for testing the health of a battery having at least one pair of positive and negative terminals connected in an engine system, the apparatus comprising:

a first detector for detecting a first voltage condition across the terminals and in response thereto indicating the battery is being operated in a state of low charge but remains capable of starting the engine;

a second detector for detecting a second voltage condition across the terminals of the battery and in response thereto indicating the battery is being operated in a state that is impending on a state of low charge which is insufficient to start the engine;

a display responsive to the first and second detectors for indicating the detection of the first and second voltage conditions; and first means for detecting a third voltage condition following a previous detection of the second voltage condition and causing the display to remove any indication of the previous detection.

18. An apparatus as set forth in claim 17 including:

second means for detecting the first connection of a load across the terminals and in response thereto changing the first voltage condition from a first value to a second value, reflecting the battery transferring from a shelf mode to an installed mode.

19. An apparatus as set forth in claim 17 wherein the second detector includes a delay means responsive to the detection of a first voltage condition by the first detector for preventing the indication of the battery being in a state that is impending on a state of low charge insufficient to start the engine if the first voltage condition is present at the terminals for more than a predetermined time period.

20. An apparatus as set forth in claim 17 wherein the first detector includes a first circuit for detecting the falling of the voltage across said terminals below a first predetermined value.

21. An apparatus as set forth in claim 20 wherein the second detector includes a second circuit for detecting the falling of the voltage across the terminals below a second predetermined value.

22. An apparatus as set forth in claim 21 wherein the second detector includes a delay circuit responsive to the second circuit for detecting the time period the voltage across the terminals remains below the first predetermined value and inhibiting any indication by the second detector that the battery is unhealthy if the time period exceeds a predetermined value.

23. An apparatus for distinguishing between a healthy but discharged battery and an unhealthy battery impending on a state of failure, the apparatus comprising:
   first voltage detection circuit for detecting a voltage of the battery falling below a first predetermined value;
   second voltage detection circuit for detecting the voltage of the battery falling below a second predetermined value which is less than the first predetermined value;
   a delay circuit responsive to the first voltage detection circuit for providing an indication of the rate of change of the voltage of the battery;
   first means responsive to the first voltage detection circuit for indicating the battery is healthy but discharged when the voltage of the battery falls below the first predetermined value; and
   second means responsive to the second voltage detection circuit and delay circuit for indicating the battery is unhealthy and impending on a state of failure if the voltage of the battery falls below the second predetermined value when the rate of change of the voltage of the battery as measured by the delay circuit is above a predetermined value.

24. In an electric storage battery having at least one pair of positive and negative terminals, a method of monitoring the voltage of a battery comprising the steps of:
   monitoring a voltage across said terminals relative to a first predetermined reference voltage whose value is selected to reflect said battery being maintained in a shelf mode;
   placing said battery into an engine system and momentarily connecting a load across said terminals in order to start said system;
   detecting the voltage across said terminals dropping below a second predetermined reference voltage during the momentary connection of said load across said terminals, thereby indicating said battery is in an installed mode; and
   adjusting the value of said first predetermined reference voltage in response to the detection of the terminal voltage dropping below said second predetermined reference voltage.

25. A method as set forth in claim 24 including the step of:
   detecting the voltage across said terminals dropping below said adjusted value of said first predetermined reference voltage and in response thereto indicating said battery is being operated in a state of low charge but remains capable of starting said engine.

26. A method as set forth in claim 24 including the step of:
   detecting the voltage across said terminals dropping below a third predetermined reference voltage during the momentary connection of said load across said terminals and indicating in response thereto said battery is being operated in a state of low charge which is impending on a state which will fail to start said engine system.

27. A method as set forth in claim 26 including the step of:
   detecting the transition of said voltage across said terminals from a value greater than a fourth predetermined reference voltage to a value less than said fourth predetermined reference voltage during the momentary connection of said load across said terminals wherein said fourth predetermined reference voltage is greater than said third predetermined reference voltage, and in response thereto, removing any existing indication of said battery being operated in a state of low charge which is impending on a state which will fail to start said engine system.

28. Apparatus for testing the condition of a battery used to start an engine in a vehicle, comprising:
   a first voltage detector responsive to the voltage of a battery under test and operable to measure an open circuit voltage of the battery relative to a predetermined open circuit voltage prior to engine start-up and after engine shutdown, in determination of the state of charge of the battery;
   a second voltage detector responsive to the voltage of a battery under test and operable to measure the voltage of the battery under load during engine start-up in determination of an engine start-up operation;
   a memory device responsive to a determination by the second voltage detector that an engine start-up operation has occurred, and monitoring the third voltage detector to record a determination that the voltage of the battery under load during engine start-up dropped below a predetermined level;
   a first visual indicator responsive to the determinations made by the first and third voltage detectors, and signaling that the battery under test is in good condition based upon the first voltage detector determining that the charge of the battery under test is sufficient to maintain the predetermined open circuit voltage and upon the third voltage detector determining that the battery voltage during an engine start-up operation remained above a predetermined level;
   a second visual indicator responsive to the determination made by the first voltage detector and signaling that the battery under test is in a poor state of charge based upon the first voltage detector determining that the charge of the battery under test is insufficient to maintain a predetermined open circuit voltage; and
   a third visual indicator responsive to the determinations made by the second and third voltage detectors, and signaling that the battery under test is in poor health based upon the second voltage detector determining that an engine start-up operation was made and upon the third voltage detector determining that the battery voltage during the engine start-up operation dropped below a predetermined level.

29. The apparatus of claim 28 further comprising an oscillator circuit providing a driving signal to the visual indicators, and causing the indicators to flash on and off when signaling.

30. The apparatus of claim 28 further comprising:
an audible alert device responsive to the determinations made by either of the first and third voltage detectors, and signaling to a motorist that the battery under test has been determined to be in poor state of charge based upon the first voltage detector determining that the charge of the battery is insufficient to maintain a predetermined open circuit voltage or that the battery has been determined to be in poor health based upon the third voltage detector determining that the battery voltage during engine start-up dropped below a predetermined level; and
means for preventing energization of said audible alert device in response to detecting operation of said engine.

31. The apparatus of claim 30 wherein the audible alert device includes:
a piezoelectric tone generator element;
an oscillator generating a driving signal for the piezoelectric device;
a circuit interposed between the piezoelectric device and the oscillator to couple the driving signal of the oscillator to the piezoelectric device; and
a control circuit providing a control to the circuit that applies the oscillator driving signal to the piezoelectric element, and controlling activation of the piezoelectric element based upon the determinations made by the first and third voltage detectors.

32. The apparatus of claim 31 wherein the control circuit includes a timing circuit for timing out a predetermined period of time for the piezoelectric element to be activated to produce an audible alert.

33. The apparatus of claim 31 wherein the means for preventing energization includes:
the piezoelectric element being responsive to an engine running in the vehicle and generating a voltage signal indicative thereof, said piezoelectric element acting as a capacitive coupling element and passing generator ripple and noise; and
an engine detector responsive to the voltage signal generated by the piezoelectric element and operable to determine whether the vehicle engine is running or stopped, and an output signal of the engine detector being provided as an input to the control circuit to prevent activation of the piezoelectric element when the engine is determined to be running.

34. The apparatus of claim 33 wherein the control circuit includes a timing circuit producing control signals to activate the piezoelectric element for a predetermined period of time to produce an audible alert signal in response to an output signal of the engine detector indicating that the vehicle engine has stopped running.

35. The apparatus of claim 30 further comprising:
a housing carrying the voltage detectors, the visual indicators and the audible alert device;
terminal means carried by the housing for making electrical connection to a battery under test; and;
connection means for coupling the terminal means to the voltage detectors so as to provide the voltage of the battery under test to the voltage detectors.

36. The apparatus of claim 35 wherein the housing is adapted for integral mounting with the case of the battery under test.

37. The apparatus of claim 28 further comprising:
a voltage divider network providing to the voltage detectors a plurality of voltage levels derived from the voltage level of the battery under test, one of the voltage levels being applied as a first input signal to a respective one of the voltage detectors;
a voltage regulator coupled to the battery under test and providing a common reference voltage level to each of the voltage detectors as a second input; and
the voltage divider network voltages being scaled so that the voltage level applied to respective voltage detector as a first input decreases below the voltage set by the voltage regulator as a second input when the terminal voltage of the battery drops to a specified voltage for the determination being made by that respective voltage detector.

38. Apparatus for testing the condition of an automotive battery used to start an engine in a vehicle, comprising:
a first voltage detector responsive to the voltage of a battery under test and operable to measure an open circuit voltage of the battery prior to engine start-up and after engine shutdown in determination of the state of charge of the battery;
a second voltage detector responsive to the voltage of a battery under test and operable to measure the voltage of the battery under load during engine start-up in determination of an engine start-up operation;
a third detector responsive to the voltage of a battery under test and operable to measure the voltage of the battery under load during engine start-up in determination of whether the battery voltage during an engine start-up operation has dropped below a predetermined level;
a first visual indicator responsive to the determinations made by the first and third voltage detectors, and signaling that the battery under test is in good condition based upon the first voltage detector determining that the charge of the battery under test is sufficient to maintain a predetermined open circuit voltage and upon the third voltage detector determining that the battery voltage during an engine start-up operation remained above a predetermined level;
a second visual indicator responsive to the determination made by the first voltage detector and signaling that the battery under test is in a poor state of charge based upon the first voltage detector determining that the charge of the battery under test is insufficient to maintain a predetermined open circuit voltage;
a third visual indicator responsive to the determinations made by the second and third voltage detectors, and signaling that the battery under test is in poor health based upon the second voltage detector determining that an engine start-up operation was made and upon the third voltage detector determining that the battery voltage during the engine start-up operation dropped below a predetermined level; and a memory device coupled voltage detector and to the second voltage detector establishing a first mode of operation wherein the first voltage detector measures open circuit voltage with respect to a first voltage detection level until an engine start-up operation occurs, whereupon a second mode of operation is established wherein the first voltage detector measures open circuit voltage with respect to a second, lower voltage detection level.

39. The apparatus of claim 38 further comprising an input terminal connected tot he memory device and adapted to receive an externally applied signal to reset the memory device to the first mode of operation.

40. An apparatus for testing the condition of a battery used to start an engine in a vehicle, comprising:
  means for comparing the magnitude of the battery voltage to a preselected discharge value and delivering a recharge battery signal in response to the preselected discharge value being greater than the magnitude of the battery voltage;
  means for comparing the magnitude of the battery voltage to a preselected failure value and delivering a failed battery signal in response to the preselected failure value being greater than the magnitude of the battery voltage;
  means for comparing the magnitude of the battery voltage to a preselected start-up value and, in response to the start-up value being greater than the magnitude of the battery voltage, delivering a start-up signal indicative of the engine being started, said preselected failure value being less than the preselected start-up value;
  memory means for receiving the failed battery signal, storing the failed battery signal, and delivering the signal stored therein;
  means for clearing the signal stored in the memory means in response to receiving the start-up signal, to permit a recheck of the battery during each engine start-up irrespective of the battery having failed a previous start-up test; and
  means for producing a first and second perceptible signal in response to respectively receiving the recharge battery signal and the stored memory means signal.

41. An apparatus, as set forth in claim 40, including means for detecting the instantaneous operation of the vehicle engine and thereupon delivering an engine operating signal, and wherein the perceptible signal producing means includes means for generating an audible alert signal in response to receiving the failed battery signal and in the absence of the engine operating signal, to permit the audible alert signal to be generated only when the engine has ceased operating.

42. An apparatus, as set forth in claim 40, including means for establishing the preselected discharge value to be a first preselected magnitude during the period of time prior to the first occurrence of the start-up signal and a second preselected magnitude during the period of time subsequent to receiving the first occurrence of the start-up signal.

43. An apparatus, as set forth in claim 40, wherein the memory means includes a logical memory device having a data input connected to a logically high source of voltage, a clock input adapted to receive the start-up signal, and a data output.

44. An apparatus, as set forth in claim 43, wherein the clearning means includes the logical memory device having a reset input adapted to receive the failed battery signal.

45. An apparatus for testing the condition of a battery used to start an engine in a vehicle, comprising:
  means for comparing the magnitude of the battery voltage to a preselected value and delivering a check battery signal in response to the preselected value being greater than the magnitude of the battery voltage;
  means for detecting the instantaneous operation of the vehicle engine and delivering an engine operating signal in response to detecting operation thereof; and
  means for generating an audible alert signal in response to receiving the check battery signal and in the absence of the operating signal whereby the audible alert signal is generated only when the engine has ceased operating.

46. An apparatus, as set forth in claim 45, wherein the engine operation detecting means includes:
  a piezoelectric element adapted for generating a signal having a magnitude correlative to the level of noise produced by the engine; and
  means for comparing the magnitude of the piezoelectric signal to a preselected value and delivering the operating signal when the piezoelectric signal is greater than the preselected value.

47. An apparatus, as set forth in claim 46, wherein the audible alert signal generating means includes:
  an oscillator adapted for generating a driving signal for said piezoelectric element to cause an audible tone to be produced from the piezoelectric element; and
  a logic circuit connected between the oscillator and the piezoelectric element, the logic circuit controlling delivery of the driving signal to the piezoelectric element in response to receiving the check battery signal and in the absence of the operating signal.

48. An apparatus, as set forth in claim 47, wherein the logic circuit includes:
  an oscillator;
  a counter having a clock signal input connected to the oscillator, a reset input adapted to reset the counter to an initial value in response to the absence of the check battery signal and the presence of the engine operating signal, and an output adapted to provide a first control signal when the counter has received a preselected number of input clock signals from the oscillator; and
  a logic gate having an input adapted to receive the driving signal, an enable input adapted to receive the driving signal, an enable input connected to the counter output and adapted to receive the first control signal, and an output connected to the piezoelectric element.

49. An apparatus, as set forth is claim 48, wherein said logic gate includes a second enable input, said counter includes a second output adapted to produce a second control signal when the counter has received a preselected number of input clock signals after producing the first control signal, and said second counter output is connected to the second enable input, said second control signal being adapted to disable said logic gate from delivering the driving signal to the piezoelectric element to permit the piezoelectric element to produce an audible alert signal for only a preselected duration of timed after the engine has ceased operating.

50. An apparatus, as set forth in claim 45, including timing means for inhibiting said audible alert signal following a preselected duration of time after the audible alert signal is first generated.

51. An apparatus for testing the condition of a battery used to start an engine in a vehicle, comprising:
means for comparing the magnitude of the battery voltage to a preselected value and delivering a check battery signal in response to the preselected value being greater than the magnitude of the battery voltage;
means for comparing the magnitude of the battery voltage to a preselected start-up value and delivering a start-up signal indicative of the engine being started if the start-up value is greater than the magnitude of the battery voltage;
means for establishing the preselected value to be a first preselected magnitude during the period of time prior to the first occurrence of the start-up signal and a second preselected magnitude during the period of time subsequent to receiving the first occurrence of the start-up signal; and
means for producing a perceptible signal in response to receiving the check battery signal.

52. An apparatus, as set forth in claim 51, wherein the first preselected magnitude is greater than the second preselected magnitude.

53. An apparatus, as set forth in claim 52, wherein the establishing means includes:
a voltage divider network having at least three resistors connected in series with said battery, and a control resistor having a first end thereof connected intermediate the first and second resistors so as to be electrically closest to the positive terminal of the battery;
a logical memory device having a set input and an output, said output being connected to the second end of said control resistor;
a voltage regulator connected to the battery; and
said start-up comparing means includes a comparator having a non-inverting input connected intermediate the second and third resistors, an inverting input connected to the voltage regulator, and an output connected to the set input of the logical memory device to permit a drop in the battery voltage below the voltage regulator voltage level to set the logical memory device output and bias the control resistor out of the voltage divider network.

54. An apparatus, as set forth in claim 51, including means for detecting the instantaneous operation of the vehicle engine and thereupon delivering an engine operating signal, and wherein the perceptible signal producing means includes means for generating an audible alert signal in response to receiving the check battery signal and in the absence of the operating signal, to cause the audible alert signal to be generated only when the engine has ceased operating.

55. An apparatus, as set forth in claim 51 including:
means for comparing the magnitude of the battery voltage to a preselected failure value and delivering a failed battery signal when the preselected failure value being greater than the magnitude of the battery voltage;
memory means for receiving the failed battery signal, storing the failed battery signal, and delivering the signal stored therein; and
means for clearing the signal stored in the memory means in response to receiving the start-up signal to permit the battery to be rechecked during each engine start-up irrespective of the battery having failed during a previous start-up test.

56. An apparatus for testing the condition of a battery used to start an engine in a vehicle, comprising:
means for comparing the magnitude of the battery voltage to a preselected discharge value and delivering a recharge signal in response to the preselected discharge value being greater than the magnitude of the battery voltage;
means for comparing the magnitude of the battery voltage to a preselected start-up value and delivering a start-up signal indicative of the engine being started in response to the start-up value being greater than the magnitude of the battery voltage;
means for establishing the preselected discharge value to be a first preselected magnitude during the period of time prior to the first occurrence of the start-up signal and a second preselected magnitude during the period of time subsequent to receiving the first occurrence of the start-up signal;
means for comparing the magnitude of the battery voltage to a preselected failure value and delivering a failed battery signal in response to the preselected failure value being greater than the magnitude of the battery voltage, said preselected failure value being less than the preselected start-up value;
memory means for receiving the failed battery signal, storing the failed battery signal, and delivering the signal stored therein;
means for clearing the signal stored in the memory means in response to receiving the start-up signal whereby the battery is rechecked during each engine start-up irrespective of the battery having failed a previous start-up test;
means for producing a first and second perceptible signal in response to respectively receiving the recharge signal and the memory means signal;
means for detecting the instantaneous operation of the vehicle engine and delivering an operating signal in response to detecting operation thereof; and
means for generating an audible alert signal in response to receiving the memory means signal and in the absence of the operating signal whereby the audible alert signal is generated only when the engine has ceased operating.

* * * * *